(12) United States Patent
Shin et al.

(10) Patent No.: US 12,469,788 B2
(45) Date of Patent: Nov. 11, 2025

(54) SEMICONDUCTOR DEVICE

(71) Applicant: Samsung Electronics Co., Ltd., Suwon-si (KR)

(72) Inventors: Junghoo Shin, Suwon-si (KR); Sanghyun Lee, Suwon-si (KR); Koungmin Ryu, Suwon-si (KR); Jongmin Baek, Suwon-si (KR); Kyungyub Jeon, Suwon-si (KR); Kyu-Hee Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 338 days.

(21) Appl. No.: 18/098,986

(22) Filed: Jan. 19, 2023

(65) Prior Publication Data
US 2023/0378068 A1  Nov. 23, 2023

(30) Foreign Application Priority Data
May 18, 2022 (KR) .................. 10-2022-0060856

(51) Int. Cl.
| | |
|---|---|
| *H10D 30/43* | (2025.01) |
| *H01L 23/522* | (2006.01) |
| *H01L 23/532* | (2006.01) |
| *H10D 30/67* | (2025.01) |
| *H10D 62/10* | (2025.01) |

(Continued)

(52) U.S. Cl.
CPC ...... *H01L 23/5329* (2013.01); *H01L 23/5226* (2013.01); *H10D 30/43* (2025.01); *H10D 30/6735* (2025.01); *H10D 62/121* (2025.01); *H10D 64/251* (2025.01); *H10D 84/85* (2025.01)

(58) Field of Classification Search
None
See application file for complete search history.

(56) References Cited

U.S. PATENT DOCUMENTS

| | | |
|---|---|---|
| 9,666,533 B1 | 5/2017 | Basker et al. |
| 10,211,092 B1 | 2/2019 | Cheng et al. |

(Continued)

FOREIGN PATENT DOCUMENTS

| | | | | |
|---|---|---|---|---|
| CN | 118299378 A | * | 7/2024 | ........... H01L 23/528 |
| EP | 4517830 A1 | * | 3/2025 | ........... H10D 30/014 |

(Continued)

*Primary Examiner* — Michael Lebentritt
(74) *Attorney, Agent, or Firm* — Muir Patent Law, PLLC

(57) ABSTRACT

A semiconductor device may include PMOSFET and NMOSFET regions spaced apart from each other on a substrate, first and second active patterns provided on the PMOSFET and NMOSFET regions, respectively, a first channel pattern on the first active pattern, a source/drain pattern electrically connected to the first channel pattern, an active contact electrically connected to the source/drain pattern, the active contact including a first conductive pattern and a first barrier pattern enclosing a portion of a side surface and a bottom surface of the first conductive pattern, a gate electrode extending in a direction crossing the first channel pattern, a gate contact electrically connected to the gate electrode, an air gap provided on the first barrier pattern and between the gate contact and the first conductive pattern, and a lower via provided on the active contact. The lower via may be adjacent to the air gap.

20 Claims, 39 Drawing Sheets

(51) Int. Cl.
    *H10D 64/23*      (2025.01)
    *H10D 84/85*      (2025.01)

(56)              References Cited

U.S. PATENT DOCUMENTS

| | | |
|---|---|---|
| 10,522,649 B2 | 12/2019 | Cheng et al. |
| 10,580,875 B2 | 3/2020 | Zang et al. |
| 10,825,721 B2 | 11/2020 | Tsai et al. |
| 11,018,221 B2 | 5/2021 | Wong et al. |
| 11,264,278 B1 | 3/2022 | Yang |
| 11,270,944 B2 | 3/2022 | Hong et al. |
| 11,342,326 B2 * | 5/2022 | Chiu .................. H10D 30/6757 |
| 2013/0320554 A1 * | 12/2013 | Barth .................. H01L 21/7682 |
| | | 257/E21.586 |
| 2014/0048939 A1 | 2/2014 | Park et al. |
| 2015/0228754 A1 * | 8/2015 | Sung .................... H01L 21/764 |
| | | 438/595 |
| 2016/0284697 A1 * | 9/2016 | Yoon .................... H10D 84/038 |
| 2021/0104524 A1 * | 4/2021 | Hwang ............. H01L 21/76805 |
| 2022/0045103 A1 * | 2/2022 | Kim ........................ H10D 64/62 |
| 2022/0069078 A1 * | 3/2022 | Yu ........................ H10D 64/251 |
| 2022/0077301 A1 * | 3/2022 | Kang .................. H10D 62/121 |

FOREIGN PATENT DOCUMENTS

| | | |
|---|---|---|
| KR | 102003523 B1 | 7/2019 |
| KR | 1020210077064 A | 6/2021 |
| KR | 1020210151277 A | 12/2021 |

\* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0060856, filed on May 18, 2022, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor.

A semiconductor device may include an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of semiconductor devices and to realize high performance semiconductor devices.

SUMMARY

An embodiment of the inventive concept provides a semiconductor device with improved electric characteristics.

According to an embodiment of the inventive concept, a semiconductor device may include a PMOSFET region and an NMOSFET region, which are spaced apart from each other in a first direction on a substrate, a first active pattern and a second active pattern provided on the PMOSFET region and the NMOSFET region, respectively, a first channel pattern on the first active pattern, a source/drain pattern electrically connected to the first channel pattern, an active contact electrically connected to the source/drain pattern, the active contact including a first conductive pattern and a first barrier pattern enclosing a portion of a side surface and a bottom surface of the first conductive pattern, a gate electrode extending in the first direction and crossing the first channel pattern, a gate contact electrically connected to the gate electrode, an air gap provided on the first barrier pattern to be adjacent to the side surface of the first conductive pattern, and a lower via provided on the active contact. The lower via may be adjacent to the air gap in the first direction, and the air gap may be provided between the gate contact and the first conductive pattern.

According to an embodiment of the inventive concept, a semiconductor device may include a PMOSFET region and an NMOSFET region on a substrate, the PMOSFET region and the NMOSFET region being adjacent to each other in a first direction, a first active pattern and a second active pattern provided on the PMOSFET region and the NMOSFET region, respectively, a source/drain pattern on the first active pattern, gate electrodes provided to cross the PMOSFET region and the NMOSFET region, an active contact electrically connected to the source/drain pattern, the active contact including a first conductive pattern and a first barrier pattern exposing an upper side surface of the first conductive pattern, an air gap provided adjacent to the upper side surface of the first conductive pattern, a lower via electrically connected to the active contact, and a gate contact electrically connected to one of the gate electrodes. The gate contact may be adjacent to the air gap in a second direction crossing the first direction, and the lower via may be offset from the gate contact in the first direction.

According to an embodiment of the inventive concept, a semiconductor device may include a substrate including a PMOSFET region and an NMOSFET region, which are spaced apart from each other in a first direction, a first active pattern on the PMOSFET region and a second active pattern on the NMOSFET region, a first source/drain pattern on the first active pattern and a second source/drain pattern on the second active pattern, a first channel pattern electrically connected to the first source/drain pattern and a second channel pattern electrically connected to the second source/drain pattern, each of the first and second channel patterns including a first semiconductor pattern, a second semiconductor pattern, and a third semiconductor pattern, which are vertically stacked to be spaced apart from each other, gate electrodes extending in the first direction and crossing the first and second channel patterns, a gate insulating layer interposed between the gate electrodes and the first and second channel patterns, a gate spacer provided on a side surface of a gate electrode, a gate capping pattern provided on a top surface of the gate electrode, a first interlayer insulating layer on the gate capping pattern, an active contact provided to penetrate the first interlayer insulating layer and electrically coupled to the first source/drain pattern, the active contact including a first barrier pattern and a first conductive pattern provided on the first barrier pattern, a second interlayer insulating layer on the first interlayer insulating layer, a gate contact provided to penetrate the first and second interlayer insulating layers and electrically coupled to the gate electrode, a first metal layer provided in the second interlayer insulating layer, the first metal layer including a lower via, which is provided to penetrate the second interlayer insulating layer and is electrically coupled to the active contact, a third interlayer insulating layer on the second interlayer insulating layer, and a second metal layer provided in the third interlayer insulating layer. A top surface of the first barrier pattern may be located at a level lower than a top surface of the first conductive pattern. The lower via may include a body portion, which is provided on a top surface of the first conductive pattern, and a first protruding portion, which protrudes from the body portion in a direction toward the substrate. The first protruding portion of the lower via may be in contact with an upper side surface of the first conductive pattern and the top surface of the first barrier pattern.

BRIEF DESCRIPTION OF THE DRAWINGS

FIGS. 4A to 9D are sectional views illustrating a method of fabricating a semiconductor device, according to an embodiment of the inventive concept.

FIGS. 4A, 5A, 6A, 7A, 8A, and 9A are sectional views taken along the line A-A' of FIG. 1.

FIGS. 4B, 5B, 6D, 7D, 8D, and 9D are sectional views taken along the line E-E' of FIG. 1.

DETAILED DESCRIPTION

Example embodiments of the inventive concepts will now be described more fully with reference to the accompanying drawings, in which example embodiments are shown.

Figure 1:
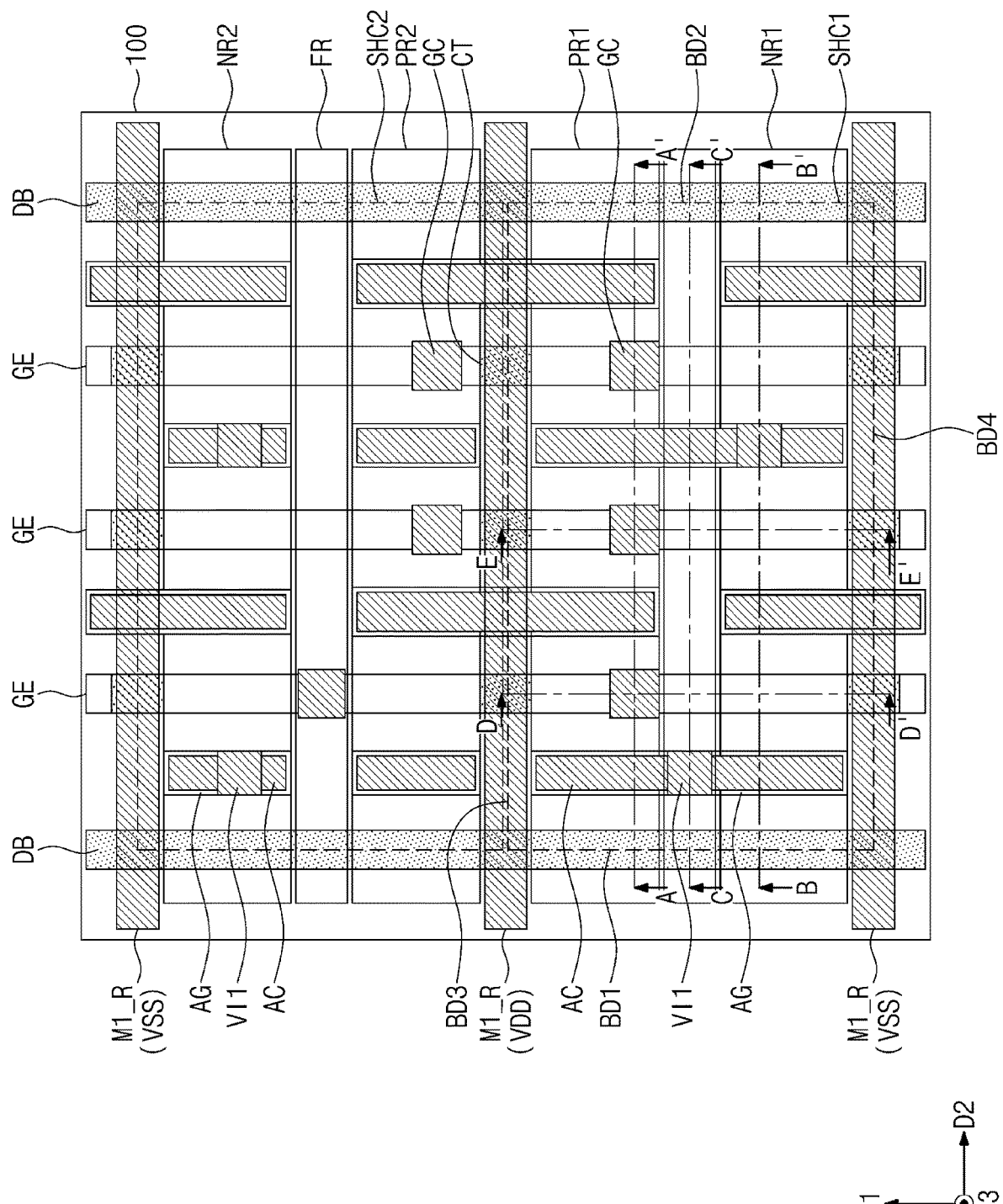
FIG. 1 is a plan view illustrating a semiconductor device according to an embodiment of the inventive concept.
Figure 2A:
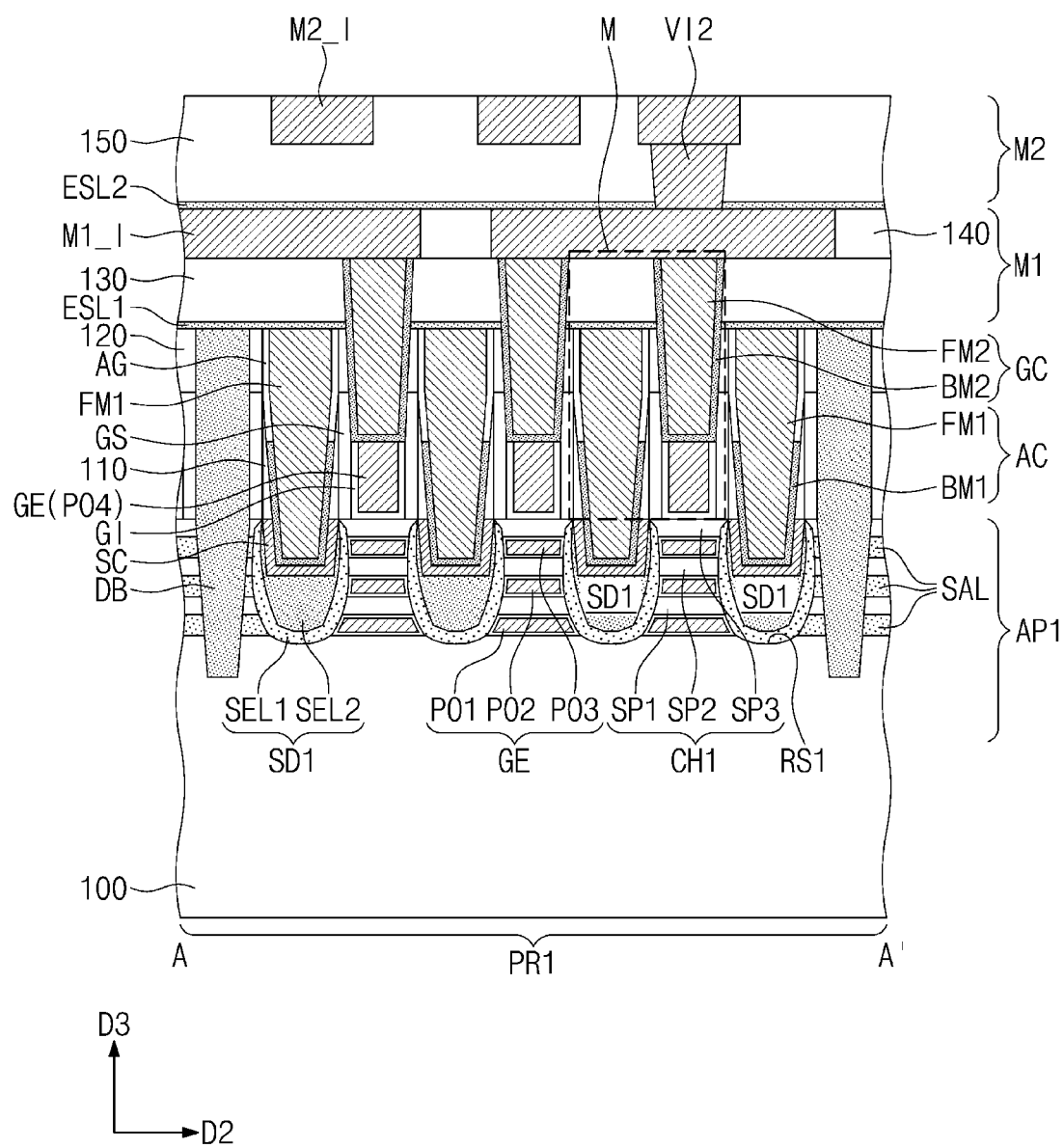
FIGS. 2A to 2E are sectional views taken along lines A-A', B-B', C-C', D-D', and E-E', respectively, of FIG. 1.
Figure 2B:
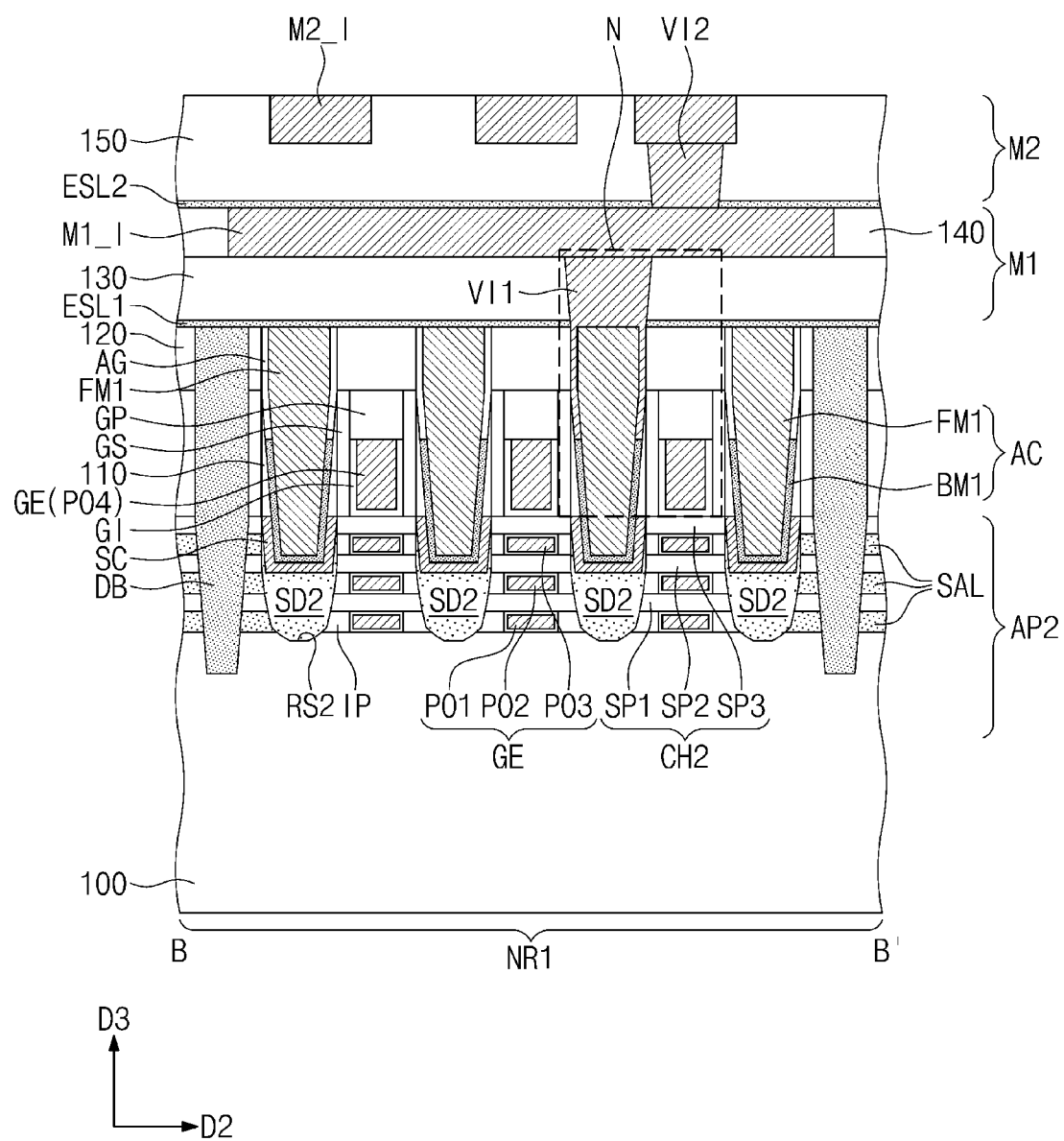
Figure 2C:
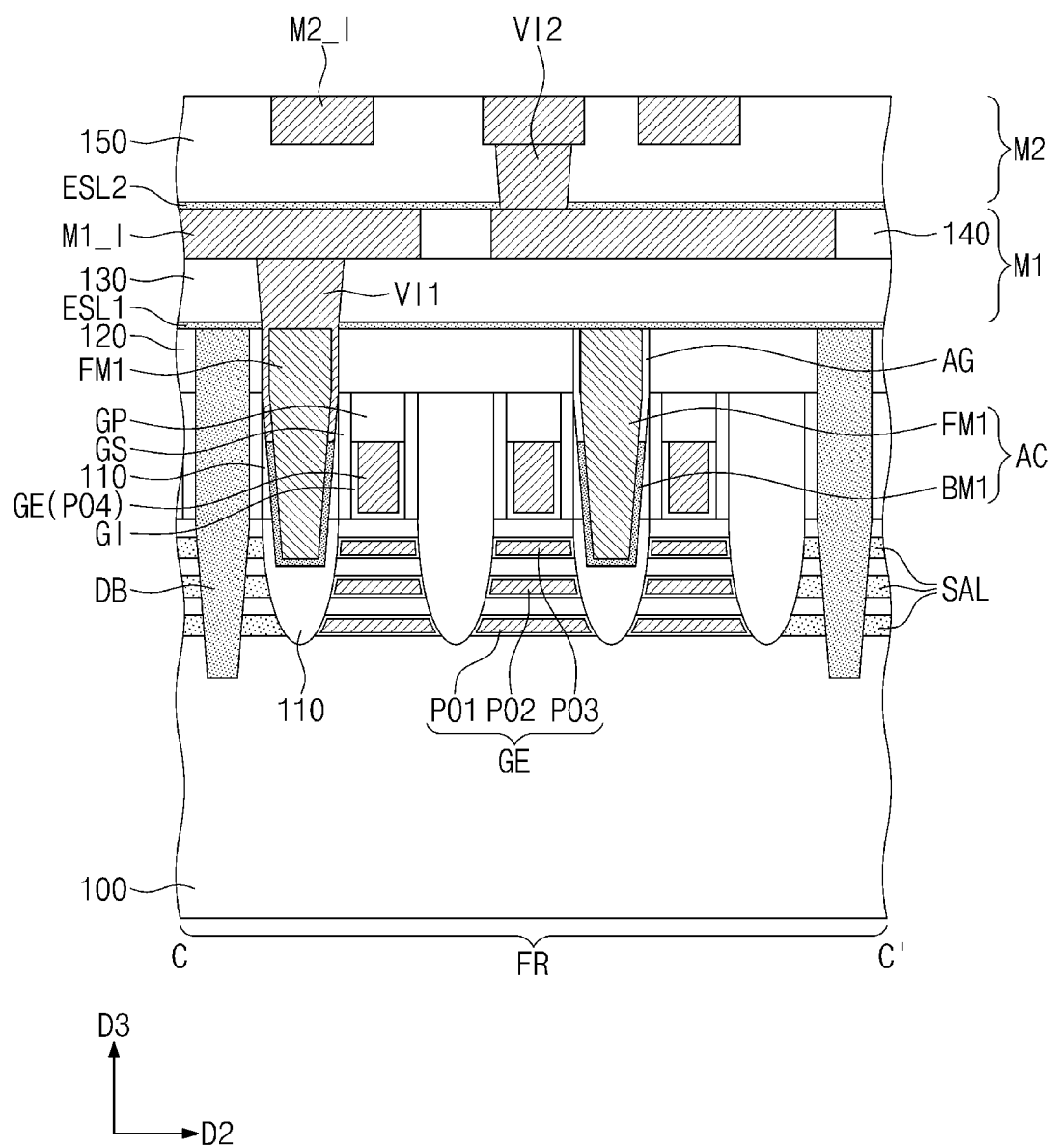
Figure 2D:
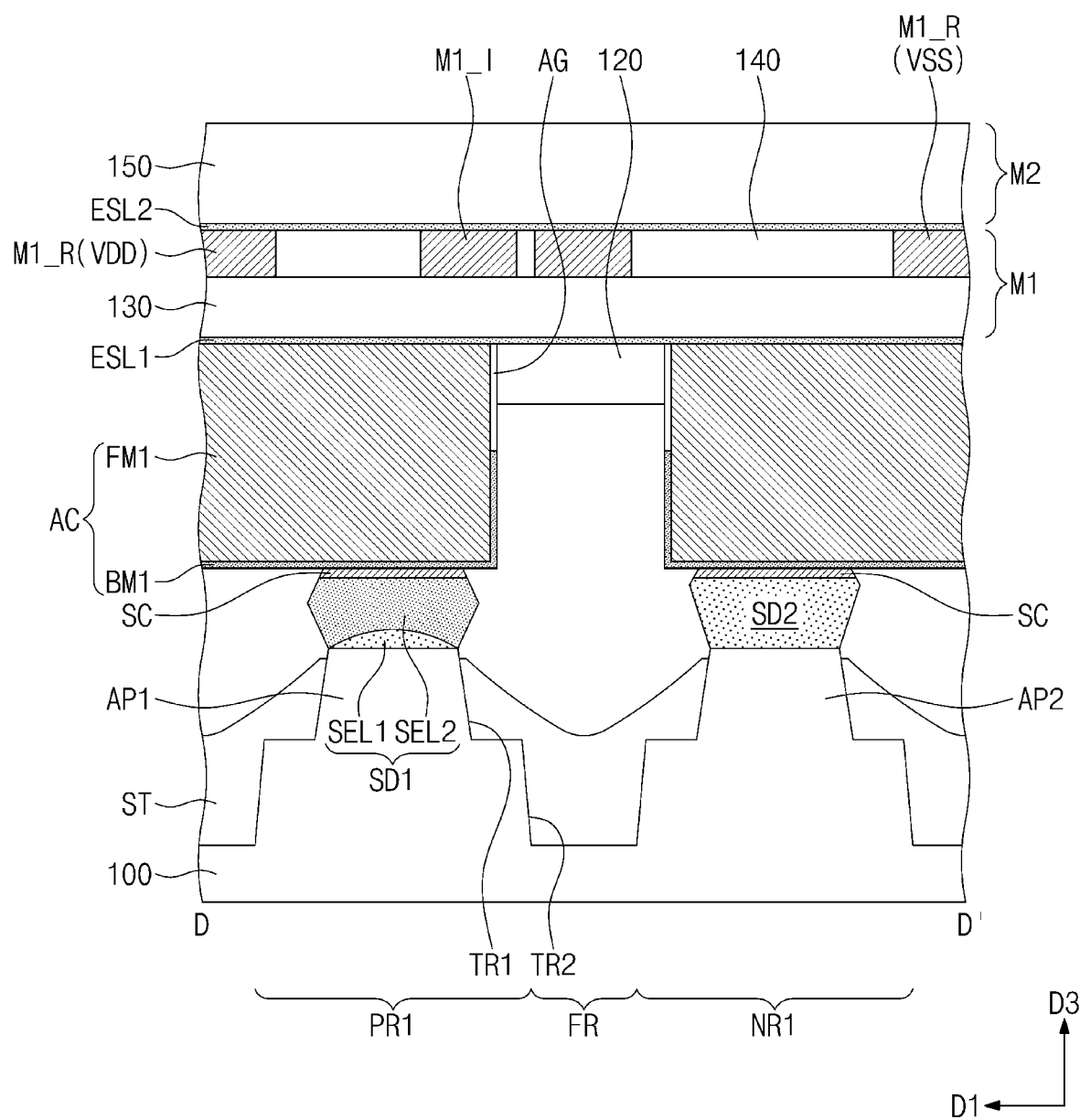
Figure 2E:
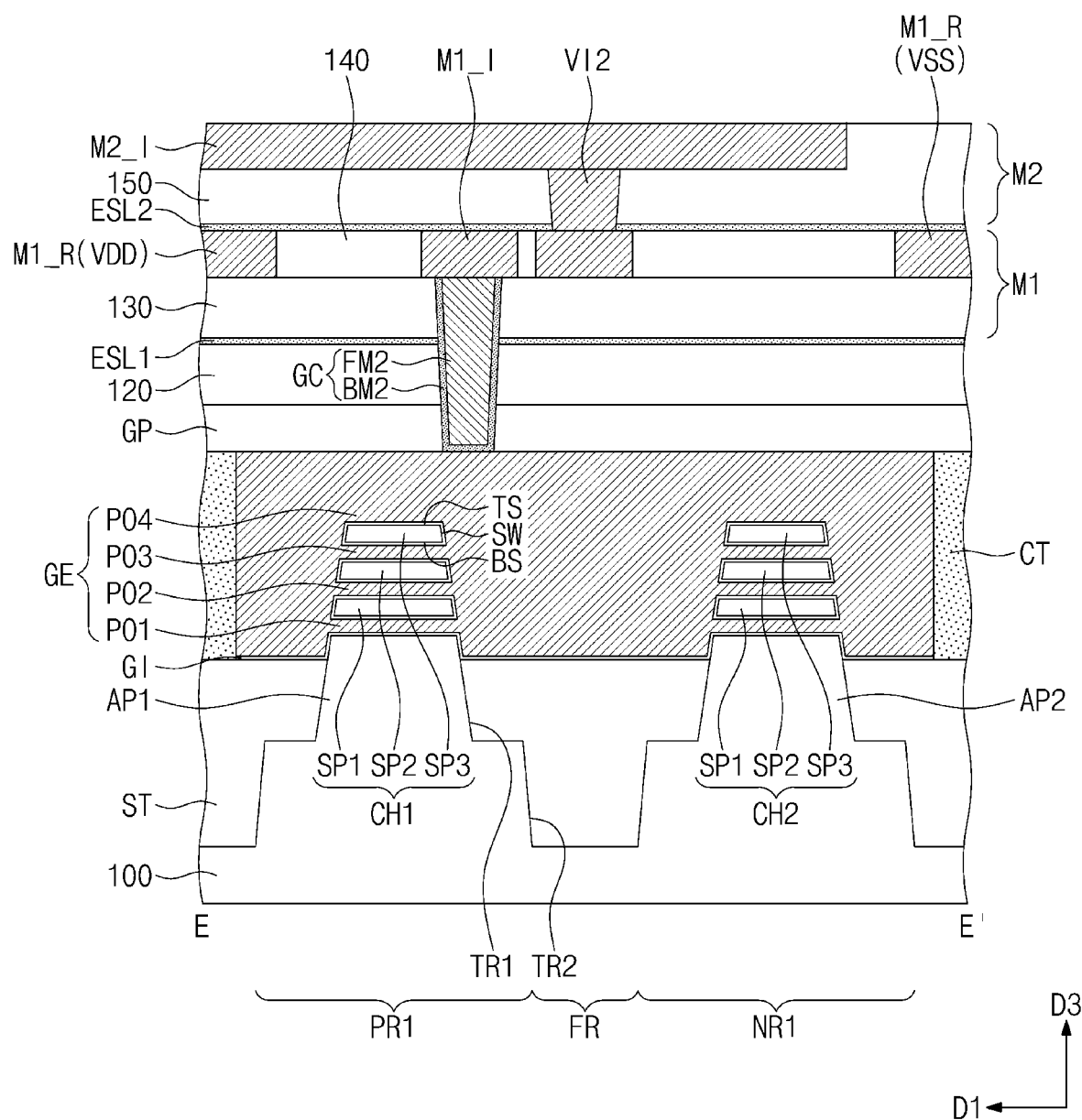
Figure 3A:
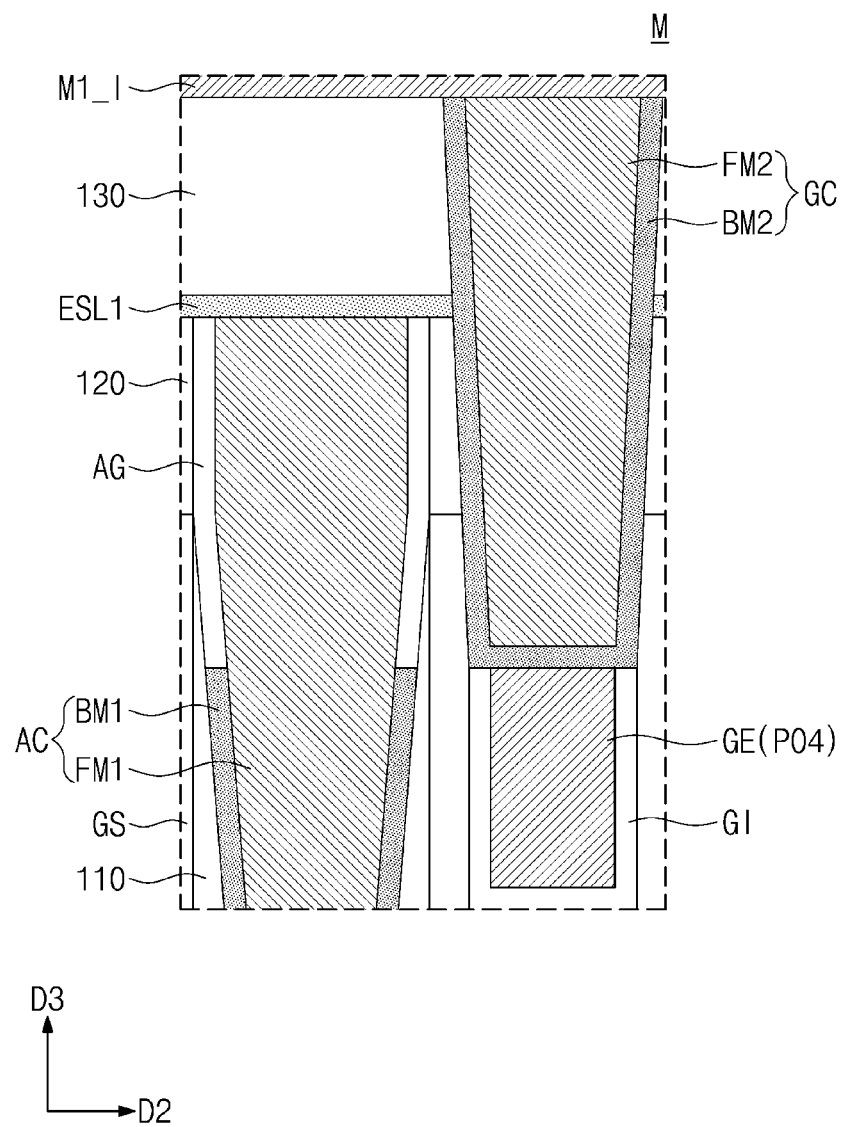
FIG. 3A is an enlarged sectional view illustrating a portion 'M' of FIG. 2A.
Figure 3B:
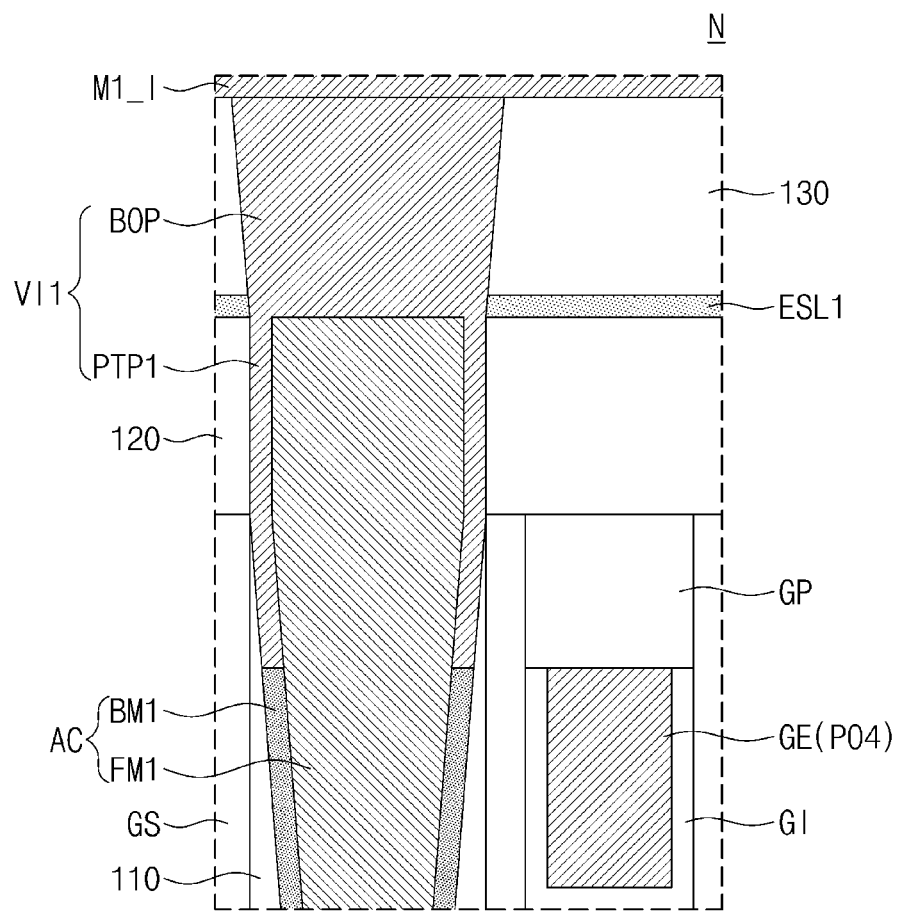
FIG. 3B is an enlarged sectional view illustrating a portion 'N' of FIG. 2B.

FIG. 1 is a plan view illustrating a semiconductor device according to an embodiment of the inventive concept. FIGS. 2A to 2E are sectional views taken along lines A-A', B-B', C-C', D-D', and E-E', respectively, of FIG. 1. FIG. 3A is an enlarged sectional view illustrating a portion 'M' of FIG. 2A. FIG. 3B is an enlarged sectional view illustrating a portion 'N' of FIG. 2B.

Referring to FIGS. 1 and 2A to 2E, first and second single height cells SHC1 and SHC2 may be provided on a substrate 100. Logic transistors constituting a logic circuit may be disposed on each of the first and second single height cells SHC1 and SHC2. The substrate 100 may be a semiconductor substrate that is formed of or includes silicon, germanium, silicon germanium, a compound semiconductor material, or the like. In an embodiment, the substrate 100 may be a silicon substrate.

The substrate 100 may include a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in a second direction D2. The first PMOSFET region PR1, the second PMOSFET region PR2, the first NMOSFET region NR1, and the second NMOSFET region NR2 may be spaced apart from each other in a first direction D1. The first single height cell SHC1 may include the first NMOSFET region NR1 and the first PMOSFET region PR1, and the second single height cell SHC2 may include the second PMOSFET region PR2 and the second NMOSFET region NR2.

The substrate 100 may include a field region FR. The field region FR may be provided between the first PMOSFET region PR1 and the first NMOSFET region NR1 and between the second PMOSFET region PR2 and the second NMOSFET region NR2. The field region FR may extend in the second direction D2.

The first PMOSFET region PR1, the second PMOSFET region PR2, the first NMOSFET region NR1, and the second NMOSFET region NR2 may be defined by a second trench TR2, which is formed in an upper portion of the substrate 100. For example, the second trench TR2 may be located between the first NMOSFET region NR1 and the first PMOSFET region PR1. The second trench TR2 may be located between the second PMOSFET region PR2 and the second NMOSFET region NR2. The second trench TR2 may be provided on the field region FR.

First active patterns AP1 may be provided on each of the first and second PMOSFET regions PR1 and PR2. Second active patterns AP2 may be provided on each of the first and second NMOSFET regions NR1 and NR2.

The first and second active patterns AP1 and AP2 may be defined by a first trench TR1, which is formed in an upper portion of the substrate 100. The first active pattern AP1 may be provided on the first and second PMOSFET regions PR1 and PR2. The second active pattern AP2 may be provided on the first and second NMOSFET regions NR1 and NR2. The first trench TR1 may be shallower than the second trench TR2. The first and second active patterns AP1 and AP2 may extend in the second direction D2. Each of the first and second active patterns AP1 and AP2 may be a vertically protruding portion of the substrate 100.

A device isolation layer ST may be provided to fill the first and second trenches TR1 and TR2. The device isolation layer ST may include or may be a silicon oxide layer. Upper portions of the first and second active patterns AP1 and AP2 may protrude vertically above the device isolation layer ST (e.g., see FIG. 2E). The device isolation layer ST may not cover the upper portions of the first and second active patterns AP1 and AP2. The device isolation layer ST may cover/contact lower side surfaces of the first and second active patterns AP1 and AP2.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked, e.g., in a vertical direction. The first to third semiconductor patterns SP1, SP2, and SP3 may be spaced apart from each other in the vertical direction (i.e., a third direction D3).

Each of the first to third semiconductor patterns SP1, SP2, and SP3 may be formed of or include silicon (Si), germanium (Ge), or silicon-germanium (SiGe). In an embodiment, each of the first to third semiconductor patterns SP1, SP2, and SP3 may be formed of or include crystalline silicon.

A plurality of first recesses RS1 may be formed in an upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. For example, each pair of the first source/drain patterns SD1 may be electrically connected to each other by the stacked first to third semiconductor patterns SP1, SP2, and SP3 of the first channel pattern CH1.

A plurality of second recesses RS2 may be formed in an upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. For example, each pair of the second source/drain patterns SD2 may be electrically connected to each other by the stacked first to third semiconductor patterns SP1, SP2, and SP3 of the second channel pattern CH2.

As used herein, components described as being "electrically connected" are configured such that an electrical signal can be transferred from one component to the other (although such electrical signal may be attenuated in strength as it transferred and may be selectively transferred).

The first and second source/drain patterns SD1 and SD2 may be epitaxial patterns, which are formed by a selective epitaxial growth (SEG) process. As an example, a top surface of each of the first and second source/drain patterns SD1 and SD2 may be positioned at substantially the same level as a top surface of the third semiconductor pattern SP3. As another example, the top surface of each of the first and second source/drain patterns SD1 and SD2 may be higher than the top surface of the third semiconductor pattern SP3.

Terms such as "same," "equal," "planar," "symmetry," or "coplanar," as used herein encompass identicality or near identicality including variations that may occur, for example, due to manufacturing processes. The term "substantially" may be used herein to emphasize this meaning, unless the context or other statements indicate otherwise.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor material (e.g., Si) as the substrate 100.

Each of the first source/drain patterns SD1 may include a first semiconductor layer SEL1 and a second semiconductor layer SEL2, which are sequentially stacked, e.g., in a vertical direction.

The first semiconductor layer SEL1 may cover an inner surface of each of the first recesses RS1. The first semiconductor layer SEL1 may have a decreasing thickness in an upward direction. For example, a thickness, in the third direction D3, of the first semiconductor layer SEL1 on a bottom surface of the first recess RS1 may be larger than a thickness, in the second direction D2, of the first semiconductor layer SEL1 on an upper portion of the first recess RS1. For example, the first semiconductor layer SEL1 may have a decreasing thickness in a direction receding from a bottom surface of the first recess RS1. The thickness of the first semiconductor layer SEL1 may be measured in a perpendicular direction to the surface of the first recess RS1 at each corresponding position. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. For example, the semiconductor layer SEL2 may fill the first recess RS1 except a portion occupied by the first semiconductor layer SEL1. A volume of the second semiconductor layer SEL2 may be larger than a volume of the first semiconductor layer SEL1.

Each of the first and second semiconductor layers SEL1 and SEL2 may be formed of or include silicon germanium (SiGe). The first semiconductor layer SEL1 may be provided to have a relatively low germanium concentration. For example, the first semiconductor layer SEL1 may have a lower germanium concentration than the second semiconductor layer SEL2. In another embodiment, the first semiconductor layer SEL1 may contain only silicon (Si) but not germanium (Ge). The germanium concentration of the first semiconductor layer SEL1 may range from 0 at % (atomic percent) to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3, e.g., in a direction approaching the top surface of the second semiconductor layer SEL2. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be higher than that in the first semiconductor layer SEL1.

The first semiconductor layer SEL1 may prevent a stacking fault/defect from occurring between the substrate 100 and the second semiconductor layer SEL2 and between the first to third semiconductor patterns SP1, SP2, and SP3 and the second semiconductor layer SEL2. The stacking fault/defect may lead to an increase of a channel resistance. The stacking fault/defect may easily occur near the bottom surface of the first recess RS1. In an embodiment, the first semiconductor layer SEL1 may be provided to have a relatively large thickness near the bottom surface of the first recess RS1, and in this case, it may be beneficial to prevent the stacking fault/defect.

During a process of recessing sacrificial layers SAL with first to third portions PO1, PO2, and PO3 of a gate electrode GE, the first semiconductor layer SEL1 may protect the second semiconductor layer SEL2. For example, the first semiconductor layer SEL1 may prevent the second semiconductor layer SEL2 from being undesirably etched by an etching material, which is used to remove the sacrificial layers SAL.

The gate electrodes GE may be provided to cross the first and second active patterns AP1 and AP2 and to extend in the first direction D1. The gate electrodes GE may be arranged (e.g., spaced apart) in the second direction D2. Each of the gate electrodes GE may vertically overlap the first and second channel patterns CH1 and CH2.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the gate electrode GE on the first PMOSFET region PR1 may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 2E, the gate electrode GE may be provided to face a top surface TS, a bottom surface BS, and opposite side surfaces SW of each of the first to third semiconductor patterns SP1, SP2, and SP3. For example, a logic transistor according to the present embodiment may be a three-dimensional field effect transistor (e.g., MBCFET), in which the gate electrode GE is provided to surround a channel pattern three-dimensionally.

Referring back to FIGS. 1 and 2A to 2E, a pair of gate spacers GS may be respectively disposed on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may have a multi-layered structure, which includes at least two different materials selected from SiCN, SiCON, and SiN.

A gate capping pattern GP may be provided on the gate electrode GE. The gate capping pattern GP may extend along the gate electrode GE or in the first direction D1. The gate capping pattern GP may be formed of or include a material having an etch selectivity with respect to first and second interlayer insulating layers 110 and 120, which will be described below. For example, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover/contact the top surface TS, the bottom surface BS, and the opposite side surfaces SW of each of the first to third semiconductor patterns SP1, SP2, and SP3. The gate insulating layer GI may cover/contact a top surface of the device isolation layer ST below the gate electrode GE (e.g., see FIG. 2E).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In an embodiment, the gate insulating layer GI may be formed of or include at least one of silicon oxide, silicon oxynitride, and/or high-k dielectric materials. The high-k dielectric materials may have dielectric constants higher than that of silicon oxide. As an example, the high-k dielectric materials may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percent). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include or be formed of a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include or be formed of a metal nitride layer. For example, the first metal pattern may include or be formed of a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include or be formed of a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

Referring back to FIG. 2B, inner spacers IP may be provided on the first NMOSFET region NR1. The inner spacers IP may be respectively interposed between the first to third portions PO1, PO2, and PO3 of the gate electrode GE and the second source/drain pattern SD2. The inner spacers IP may be in contact with the second source/drain pattern SD2. Each of the first to third portions PO1, PO2, and PO3 of the gate electrode GE may be spaced apart from the second source/drain pattern SD2 by the inner spacers IP.

A first interlayer insulating layer 110 may be provided on the substrate 100. The first interlayer insulating layer 110 may cover/contact the gate spacers GS and the first and second source/drain patterns SD1 and SD2. For example, the first interlayer insulating layer 110 may contact side surfaces of the gate spacers GS. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP and the first interlayer insulating layer 110. For example, a bottom surface of the second interlayer insulating layer 120 may contact the top surface of the first interlayer insulating layer 110 and the top surface of the gate capping pattern GP. As an example, each of the first and second interlayer insulating layers 110 and 120 may include or be formed of a silicon oxide layer.

A pair of division structures DB, which are opposite to each other in the second direction D2, may be provided at both sides of each of the first and second single height cells SHC1 and SHC2. The division structure DB may extend in the first direction D1 to be parallel to the gate electrodes GE. The division structure DB may be provided to penetrate the first and second interlayer insulating layers 110 and 120 and may extend into the first and second active patterns AP1 and AP2. The division structure DB may be provided to penetrate an upper portion of each of the first and second active patterns AP1 and AP2. The division structure DB may be provided to separate logic cells, which are adjacent to each other, from each other.

The upper portion of each of the first and second active patterns AP1 and AP2 may further include the sacrificial layers SAL which are provided adjacent to the division structure DB. The sacrificial layers SAL may be stacked to be spaced apart from each other, e.g., in a vertical direction. Each of the sacrificial layers SAL may be located at the same level as a corresponding one of the first to third portions PO1, PO2, and PO3 of the gate electrode GE. The division structure DB may be provided to penetrate the sacrificial layers SAL.

The sacrificial layers SAL may be formed of or include silicon-germanium (SiGe). A germanium concentration of each of the sacrificial layers SAL may range from 10 at % to 30 at %. The germanium concentration of the sacrificial layer SAL may be higher than the germanium concentration of the first semiconductor layer SEL1 described above.

Active contacts AC may be provided to penetrate the first and second interlayer insulating layers 110 and 120, e.g., in a vertical direction, and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that extends in the first direction D1.

The active contact AC may be a self-aligned contact. For example, the active contact AC may be formed by a self-alignment process that is performed using the gate capping pattern GP and the gate spacer GS. For example, the active contact AC may cover/contact at least a portion of the side surface of the gate spacer GS. Although not shown, the active contact AC may cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

A first etch stop layer ESL1 may be provided to cover/contact the second interlayer insulating layer 120. In an embodiment, the first etch stop layer ESL1 may be formed of or include at least one of aluminum nitride, silicon nitride, or aluminum oxide.

A third interlayer insulating layer 130 and a fourth interlayer insulating layer 140 may be provided on the first etch stop layer ESL1. In an embodiment, each of the third and fourth interlayer insulating layers 130 and 140 may include or may be a silicon oxide layer. The first etch stop layer ESL1 may be interposed between the second interlayer insulating layer 120 and the third interlayer insulating layer 130. As another example, the first etch stop layer ESL1 may not be provided between the second interlayer insulating layer 120 and the third interlayer insulating layer 130 and may be omitted.

A gate contact GC may be provided to vertically penetrate the third interlayer insulating layer 130, the first etch stop layer ESL1, the second interlayer insulating layer 120, and the gate capping pattern GP and may be electrically connected to the gate electrode GE. The gate contact GC may be interposed between the gate electrode GE and a second lower interconnection line M1_I, which will be described below.

The active contact AC may include a first conductive pattern FM1 and a first barrier pattern BM1 which is provided to enclose a portion of the first conductive pattern FM1. The gate contact GC may include a second conductive pattern FM2 and a second barrier pattern BM2 which is provided to enclose the second conductive pattern FM2. For example, each of the first and second conductive patterns FM1 and FM2 may be formed of or include at least one of metallic materials (e.g., aluminum, copper, tungsten, molybdenum, and cobalt). The first barrier pattern BM1 may cover/contact a portion of a side surface and a bottom surface of the first conductive pattern FM1. The second barrier pattern BM2 may cover/contact side and bottom surfaces of the second conductive pattern FM2. Each of the first and second barrier patterns BM1 and BM2 may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

An air gap AG may be formed by recessing an upper portion of the first barrier pattern BM1. When viewed in a plan view, the air gap AG may be provided to enclose the first conductive pattern FM1. The air gap AG may be an empty space that is adjacent to the first conductive pattern FM1. For example, the air gap AG may be in a vacuum state or may be filled with air or gas.

The fourth interlayer insulating layer 140 may be provided on the third interlayer insulating layer 130. A first metal layer M1 may be provided in the third interlayer insulating layer 130 and the fourth interlayer insulating layer 140. The first metal layer M1 may include first lower interconnection lines M1_R, second lower interconnection lines M1_I, and lower vias VI1. The first and second lower interconnection lines M1_R and M1_I may extend in the second direction D2. Each of the first lower interconnection lines M1_R may be a power line. A drain voltage VDD or a source voltage VSS may be provided to the first lower interconnection line M1_R. The first and second lower interconnection lines M1_R and M1_I may be disposed in the fourth interlayer insulating layer 140.

Referring to FIG. 1, a first cell border BD1 extending in the first direction D1 may be defined in a portion of the first single height cell SHC1. A second cell border BD2 extending in the first direction D1 may be defined in a portion of the first single height cell SHC1 that is opposite to the first cell border BD1. A third cell border BD3 extending in the second direction D2 may be defined in the first single height cell SHC1. A fourth cell border BD4 extending in the second direction D2 may be defined in a portion of the first single height cell SHC1 that is opposite to the third cell border BD3.

The first lower interconnection line M1_R, which is applied with the drain voltage VDD (e.g., a power voltage), may be disposed on the third cell border BD3. The first lower interconnection line M1_R applied with the drain voltage VDD may extend along the third cell border BD3 and in the second direction D2. The first lower interconnection line M1_R, which is applied with the source voltage VSS (e.g., a ground voltage), may be disposed on the fourth cell border BD4. The first lower interconnection line M1_R applied with the source voltage VSS may extend along the fourth cell border BD4 and in the second direction D2.

The second lower interconnection lines M1_I may be disposed in the first direction D1 between the first lower interconnection lines M1_R, to which the drain voltage VDD and the source voltage VSS are respectively applied.

The lower vias VI1 may be provided below the first lower interconnection lines M1_R and the second lower interconnection lines M1_I. The lower vias VI1 may be respectively interposed between the active contacts AC and the first and second lower interconnection lines M1_R and M1_I. The lower vias VI1 may be provided to penetrate the third interlayer insulating layer 130 and the first etch stop layer ESL1 and may be electrically connected to the active contacts AC.

The lower interconnection line M1_R or M1_I of the first metal layer M1 and the lower via VI1 thereunder may be formed by separate processes. For example, each of the lower interconnection line M1_R or M1_I and the lower via VI1 may be formed by a single damascene process. The semiconductor device according to the present embodiment may be fabricated using a sub-20 nm process.

Gate cutting patterns CT may be disposed on the third and fourth cell borders BD3 and BD4 of the first single height cell SHC1. The gate cutting patterns CT may be disposed on the border, in the first direction D1, of each of the first and second single height cells SHC1 and SHC2. The gate cutting patterns CT may be arranged at a first pitch along the third cell border BD3. The gate cutting patterns CT may be arranged at the first pitch along the fourth cell border BD4. When viewed in a plan view, the gate cutting patterns CT on the third and fourth cell borders BD3 and BD4 may be disposed to respectively overlap the gate electrodes GE. For example, the gate cutting patterns CT may vertically overlap the gate electrodes GE. The gate cutting patterns CT may be formed of or include at least one of insulating materials (e.g., silicon oxide or silicon nitride).

The gate electrode GE on the first single height cell SHC1 may be spaced apart from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. For example, the gate electrode GE extending in the first direction D1 may be divided into a plurality of the gate electrodes GE by the gate cutting patterns CT.

A second etch stop layer ESL2 may be provided to cover the fourth interlayer insulating layer 140. In an embodiment, the second etch stop layer ESL2 may be formed of or include at least one of aluminum nitride, silicon nitride, or aluminum oxide. A fifth interlayer insulating layer 150 may be provided on the second etch stop layer ESL2. In an embodiment, the fifth interlayer insulating layer 150 may include a silicon oxide layer. The second etch stop layer ESL2 may be interposed between the fourth interlayer insulating layer 140 and the fifth interlayer insulating layer 150.

A second metal layer M2 may be provided in the fifth interlayer insulating layer 150. The second metal layer M2 may include upper interconnection lines M2_I and upper vias VI2. Each of the upper interconnection lines M2_I may be a line-shaped pattern or a bar-shaped pattern extending in the first direction D1. The upper vias VI2 may be provided below the upper interconnection lines M2_I. The upper vias VI2 may be respectively interposed between the lower interconnection lines M1_R and M1_I and the upper interconnection lines M2_I. The upper via VI2 may be provided to penetrate the second etch stop layer ESL2 and may be electrically connected to the first metal layer M1. For example, the upper via VI2 may contact a lower interconnection line M1_I of the first metal layer M1.

An upper interconnection line M2_I of the second metal layer M2 and the upper via VI2 thereunder may be formed by the same process and may form a single object. For example, the upper interconnection line M2_I and the upper via VI2 of the second metal layer M2 may be formed by a dual damascene process. For example, the upper interconnection line M2_I and the upper via VI2 of the second metal layer M2 may be integrally formed as one body.

The lower interconnection lines M1_R and M1_I of the first metal layer M1 and the upper interconnection lines M2_I of the second metal layer M2 may be formed of or include the same conductive material or different conductive materials. For example, the lower interconnection lines M1_R and M1_I and the upper interconnection lines M2_I may be formed of or include at least one of metallic materials (e.g., aluminum, copper, tungsten, molybdenum, or cobalt). Each of the upper and lower vias VI2 and VI1 may be formed of or include at least one of metallic materials (e.g., aluminum, copper, tungsten, molybdenum, and cobalt).

In an embodiment, although not shown, additional metal layers (e.g., M3, M4, M5, and so forth) may be further stacked on the fifth interlayer insulating layer 150. Each of the stacked metal layers may include routing lines.

The air gap AG and the lower via VI1 may be described with reference to FIGS. 3A and 3B.

Referring to FIG. 3A, the air gap AG may be provided near an upper side surface of the first conductive pattern FM1. In an embodiment, the air gap AG may be defined by the upper side surface of the first conductive pattern FM1, a top surface of the first barrier pattern BM1, and a bottom surface of the first etch stop layer ESL1. The top surface of the first barrier pattern BM1 may be located at a level lower than a top surface of the first conductive pattern FM1. The first barrier pattern BM1 may be provided to enclose a lower side surface and a bottom surface of the first conductive pattern FM1. The upper side surface of the first conductive pattern FM1 may be exposed by the first barrier pattern BM1. For example, the upper side surface of the first conductive pattern FM1 may not contact the first barrier pattern BM1.

As an example, the top surface of the first barrier pattern BM1 may be located at substantially the same level as a top surface of the fourth portion PO4 of the gate electrode GE. As another example, the top surface of the first barrier pattern BM1 may be located at a level higher than the top surface of the fourth portion PO4 of the gate electrode GE. The air gap AG may be provided between the first conductive pattern FM1 and the gate contact GC. The air gap AG may be adjacent to the gate contact GC in the second direction D2. For example, a portion of a gate spacer GS, a portion of the first interlayer insulating layer 110 and/or a portion of the second interlayer insulating layer 120 may be interposed between the air gap AG and the gate contact GC.

Referring to FIG. 3B, the lower via VI1 may include a body portion BOP, which is provided on the top surface of the first conductive pattern FM1, and a first protruding portion PTP1, which is provided to protrude from a bottom surface of the body portion BOP toward the air gap AG or toward the barrier pattern BM1. The body portion BOP of the lower via VI1 may be provided to penetrate the first etch stop layer ESL1. The first protruding portion PTP1 of the lower via VI1 may protrude from the bottom surface of the body portion BOP toward the top surface of the first barrier pattern BM1. The first protruding portion PTP1 may be in contact with the top surface of the first barrier pattern BM1. The first protruding portion PTP1 may be in contact with the upper side surface of the first conductive pattern FM1.

Referring to FIGS. 3A and 3B, a top surface of the gate contact GC may be coplanar with a top surface of the third interlayer insulating layer 130. A top surface of the body portion BOP of the lower via VI1 may be coplanar with the top surface of the third interlayer insulating layer 130. The top surface of the gate contact GC and the top surface of the lower via VI1 may be coplanar with each other.

Referring to FIG. 1, the first protruding portion PTP1 of the lower via VI1 may be adjacent to the air gap AG in the first direction D1. For example, the first protruding portion PTP1 of the lower via VI1 may define a boundary of the air gap AG. The lower via VI1 may be offset from the gate contact GC in the first direction D1. For example, the lower via VI1 may be offset from the gate contact GC in the first and second directions D1 and D2. For example, the lower via VI1 may be spaced apart from the gate contact GC in a diagonal direction. For example, the lower via VI1 may not overlap the gate contact GC in the first and second directions D1 and D2. Accordingly, it may be possible to prevent a short circuit from being formed between the lower via VI1 and the gate contact GC. On the first single height cell SHC1, the gate contact GC may vertically overlap the first PMOSFET region PR1, and the lower via VI1 may vertically overlap the field region FR. In an embodiment, the gate contact GC may vertically overlap the first PMOSFET region PR1, and the lower via VI1 may vertically overlap the first NMOSFET region NR1. On the second single height cell SHC2, the gate contact GC may vertically overlap the field region FR, and the lower via VI1 may vertically overlap the second PMOSFET region PR2 or the second NMOSFET region NR2.

According to an embodiment of the inventive concept, the air gap AG, which is adjacent to or on the upper side surface of the first conductive pattern FM1, may be provided by recessing an upper portion of the first barrier pattern BM1. Thus, it may be possible to prevent a short circuit from being formed between the active contact AC and the gate contact GC, which are adjacent to each other. In addition, since the air gap AG is formed, a parasitic capacitance between the active contact AC and the gate contact GC may be reduced. Furthermore, the lower via VI1, which is electrically connected to the active contact AC, may include the first protruding portion PTP1, which protrudes toward the air gap AG or toward the barrier pattern BM1 and is in contact with the upper side surface of the first conductive pattern FM1. Thus, an electrical resistance between the lower via VI1 and the active contact AC may be reduced. In addition, since the lower via VI1 is disposed at a position that is offset from the gate contact GC in the first direction D1, a short circuit may be prevented from being formed between the first protruding portion PTP1 and the gate contact GC. Accordingly, the electric characteristics of the semiconductor device may be improved.

FIGS. 4A to 9D are sectional views illustrating a method of fabricating a semiconductor device, according to an embodiment of the inventive concept. FIGS. 4A, 5A, 6A, 7A, 8A, and 9A are sectional views taken along the line A-A' of FIG. 1. FIGS. 6B, 7B, 8B, and 9B are sectional views taken along the line B-B' of FIG. 1. FIGS. 6C, 7C, 8C, and 9C are sectional views taken along the line D-D' of FIG. 1. FIGS. 4B, 5B, 6D, 7D, 8D, and 9D are sectional views taken along the line E-E' of FIG. 1.

Figure 4A:
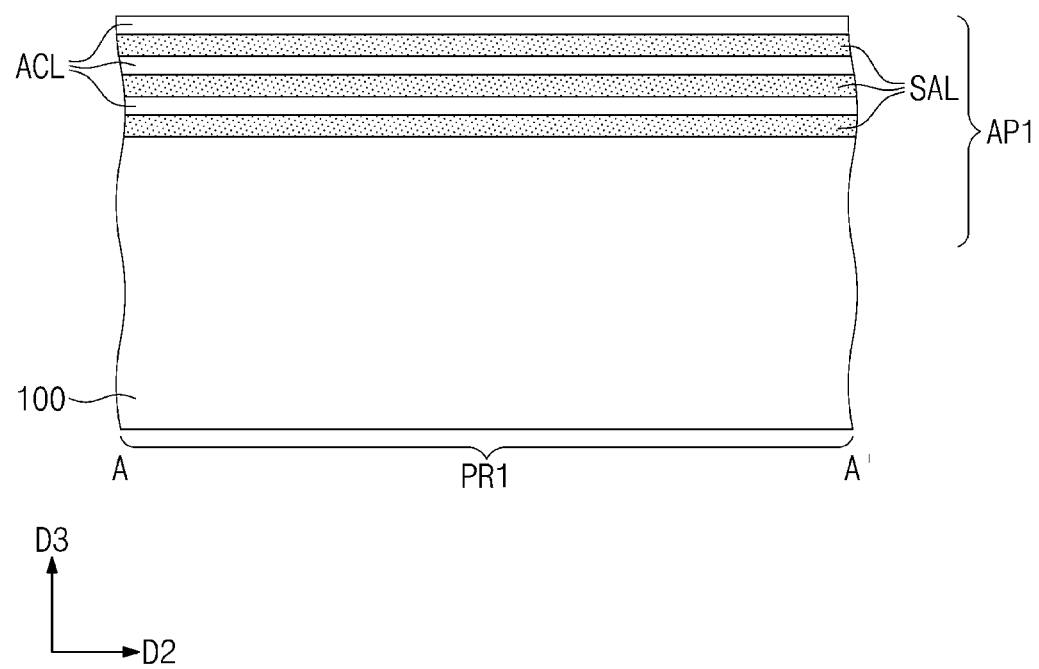
Figure 4B:
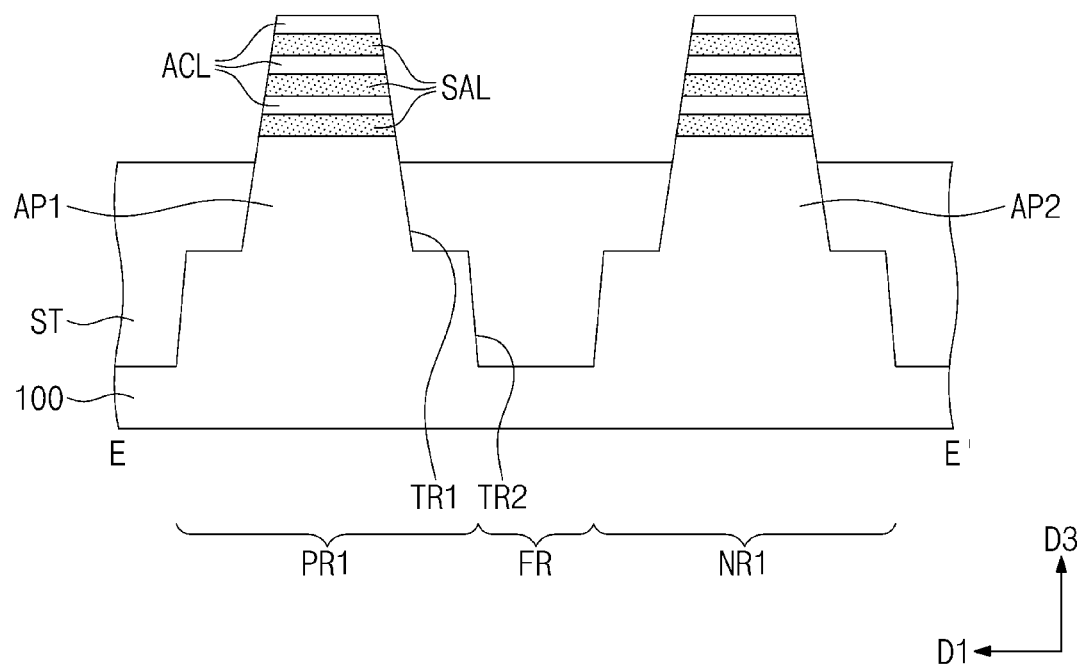

Referring to FIGS. 4A and 4B, the sacrificial layers SAL and active layers ACL may be alternately formed on the substrate 100. Each of the sacrificial and active layers SAL and ACL may be formed of or include at least one of silicon (Si), germanium (Ge), or silicon germanium (SiGe), but the material of the active layers ACL may be different from that of the sacrificial layers SAL.

For example, the sacrificial layers SAL may be formed of or include silicon-germanium (SiGe), and the active layers ACL may be formed of or include silicon (Si). A germanium concentration of each of the sacrificial layers SAL may range from 10 at % to 30 at %.

The substrate 100 including the first PMOSFET region PR1, the second PMOSFET region PR2, the first NMOSFET region NR1, and the second NMOSFET region NR2 may be provided. Mask patterns may be formed on the first PMOSFET region PR1, the second PMOSFET region PR2, the first NMOSFET region NR1, and the second NMOSFET region NR2 of the substrate 100, respectively. The mask pattern may be a line-shaped pattern or a bar-shaped pattern that extends in the second direction D2.

A first patterning process, in which the mask patterns are used as an etch mask, may be performed to form the first trench TR1 defining the first and second active patterns AP1 and AP2. The first active pattern AP1 may be formed on the first PMOSFET region PR1 and the second PMOSFET region PR2. The second active pattern AP2 may be formed on the first NMOSFET region NR1 and the second NMOSFET region NR2. Each of the first and second active patterns AP1 and AP2 may include the sacrificial layers SAL and the active layers ACL, which are alternately stacked in an upper portion thereof.

A second patterning process may be performed on the substrate 100 to form the second trench TR2 defining the first PMOSFET region PR1, the second PMOSFET region PR2, the first NMOSFET region NR1, and the second NMOSFET region NR2. The second trench TR2 may be formed to have a depth that is larger than that of the first trench TR1.

The device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed. For example, the device isolation layer ST may cover and contact side surfaces of the first and second active patterns AP1 and AP2.

The device isolation layer ST may be formed of or include at least one of insulating materials (e.g., silicon oxide). Each of the first and second active patterns AP1 and AP2 may include an upper portion protruding above the device isolation layer ST. For example, the upper portion of each of the first and second active patterns AP1 and AP2 may be a protruding pattern, which vertically extends above the device isolation layer ST.

Figure 5A:
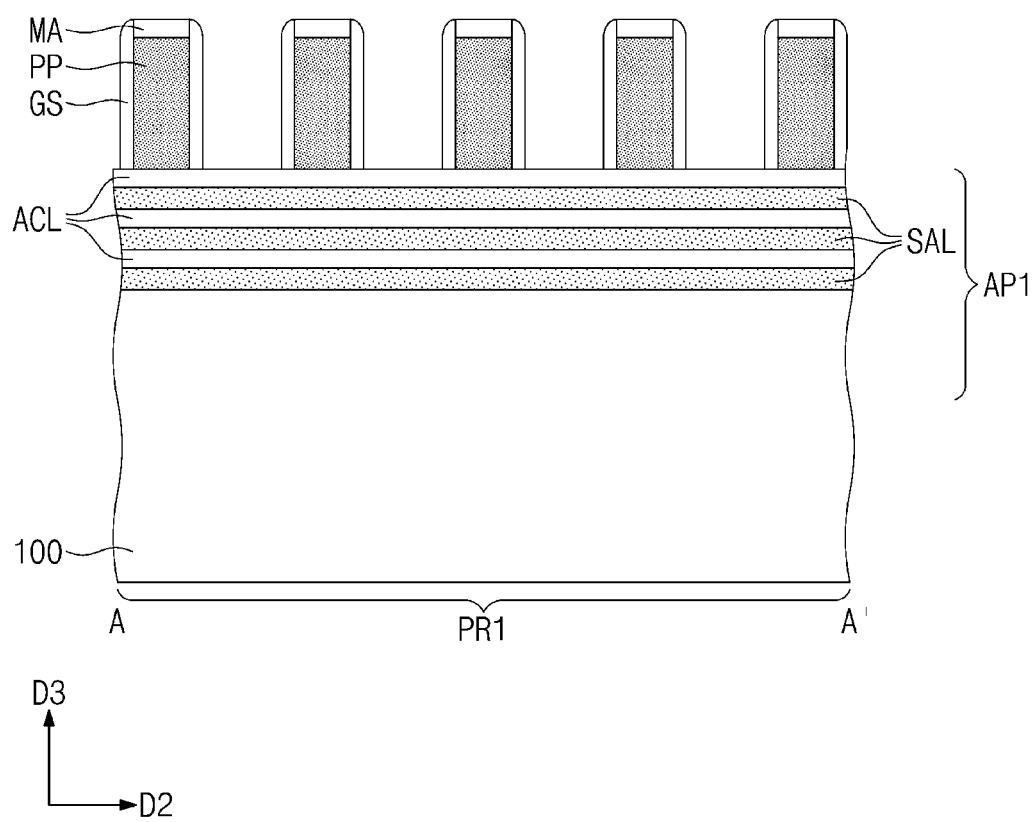
Figure 5B:
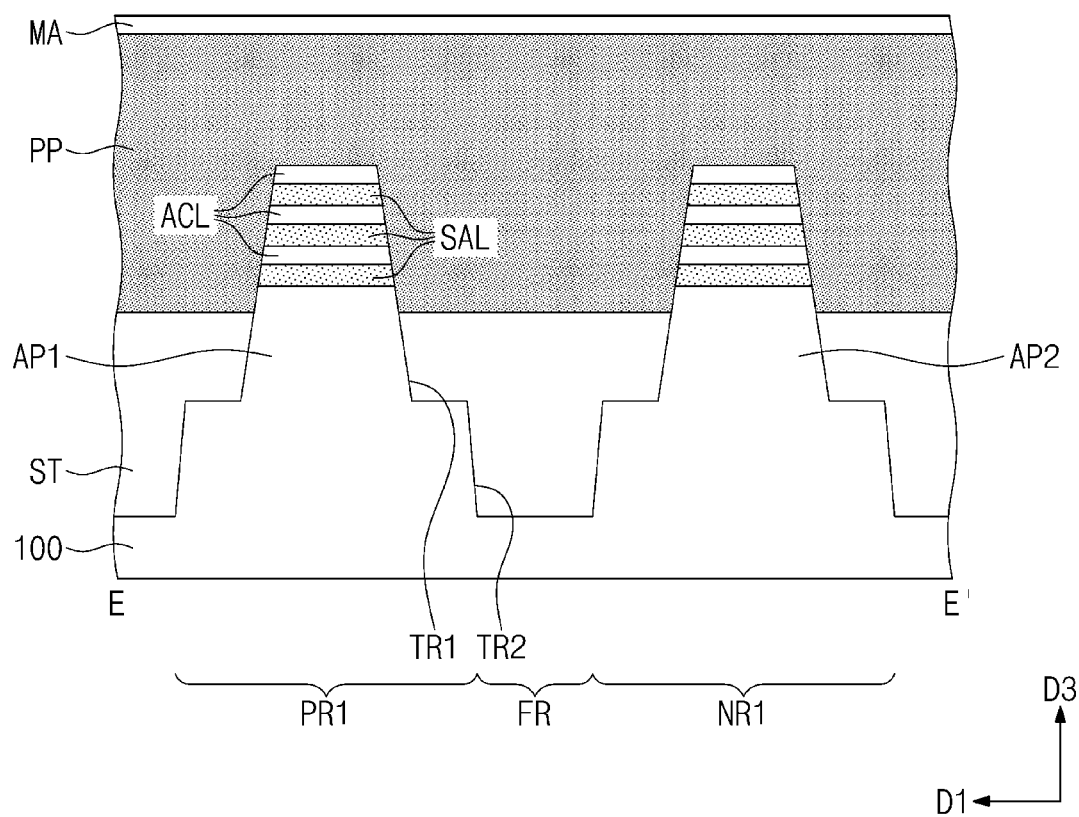
Figure 6A:
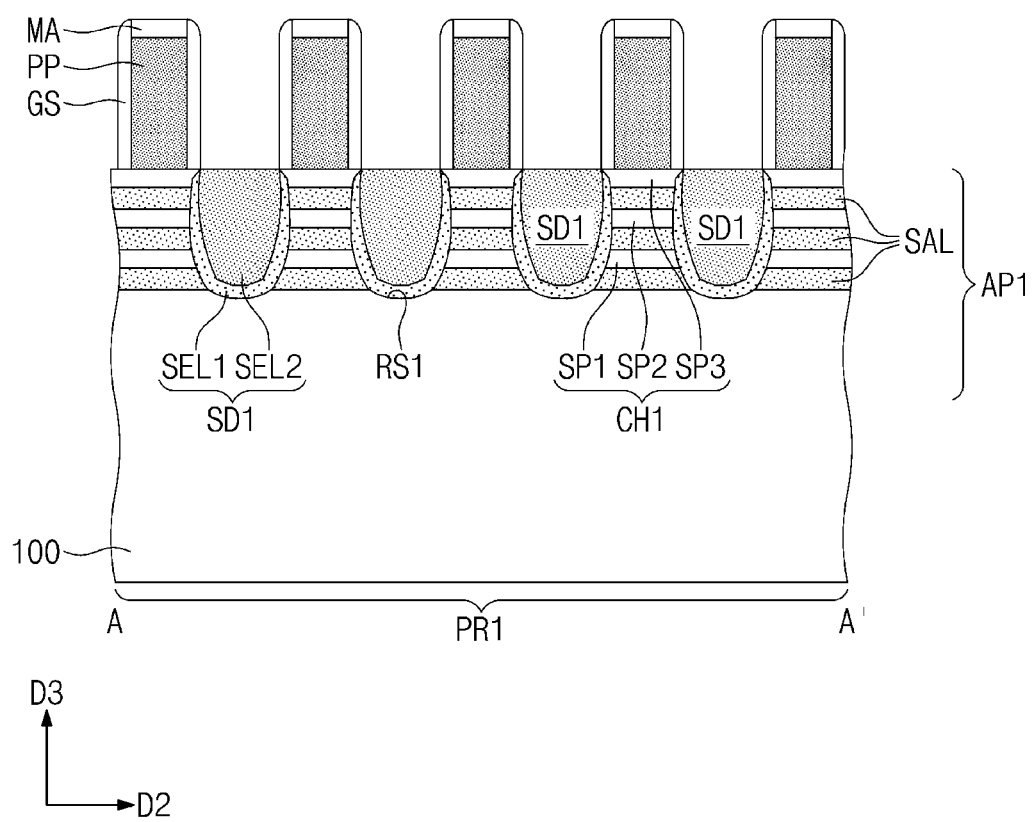
Figure 6B:
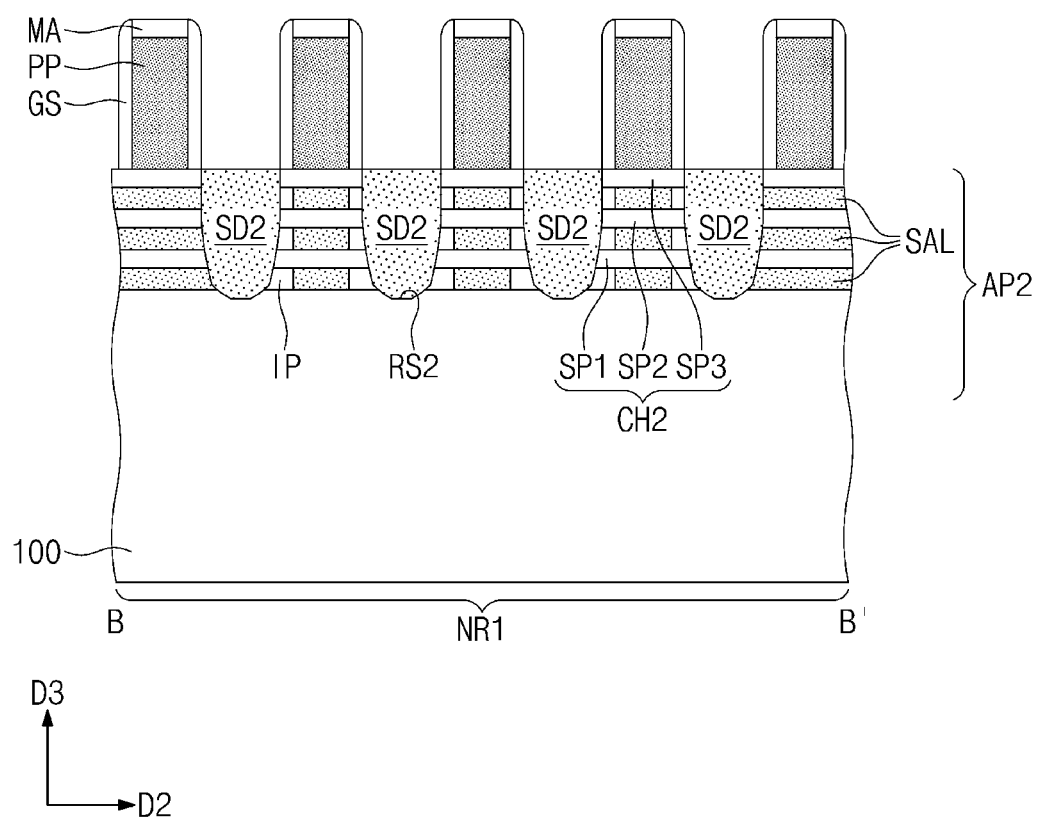
FIGS. 6B, 7B, 8B, and 9B are sectional views taken along the line B-B' of FIG. 1.
Figure 6C:
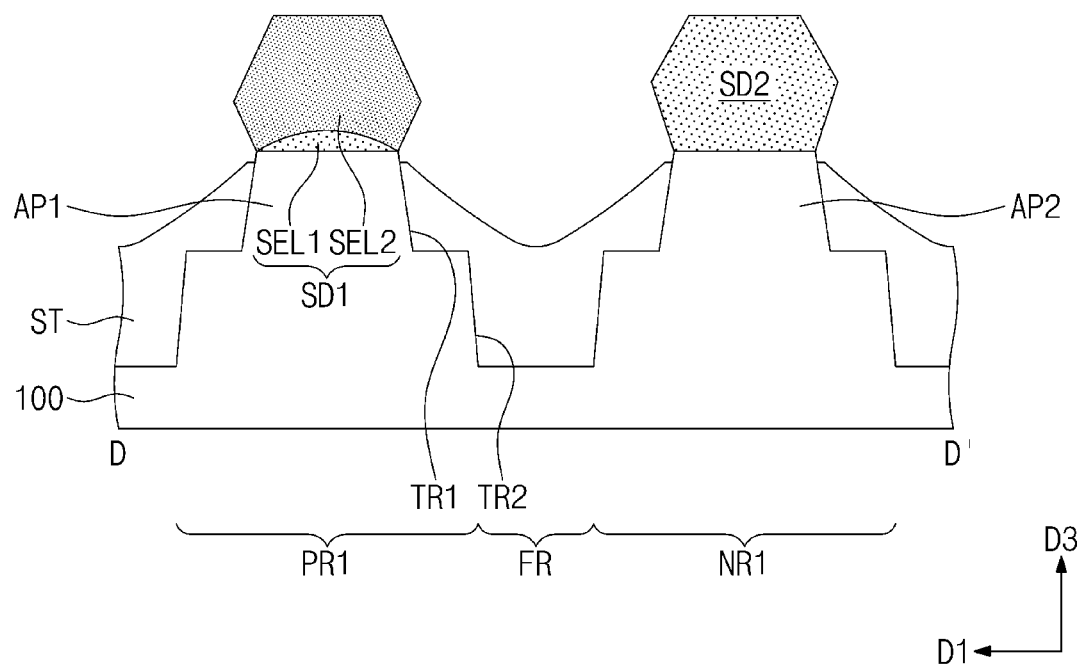
FIGS. 6C, 7C, 8C, and 9C are sectional views taken along the line D-D' of FIG. 1.
Figure 6D:
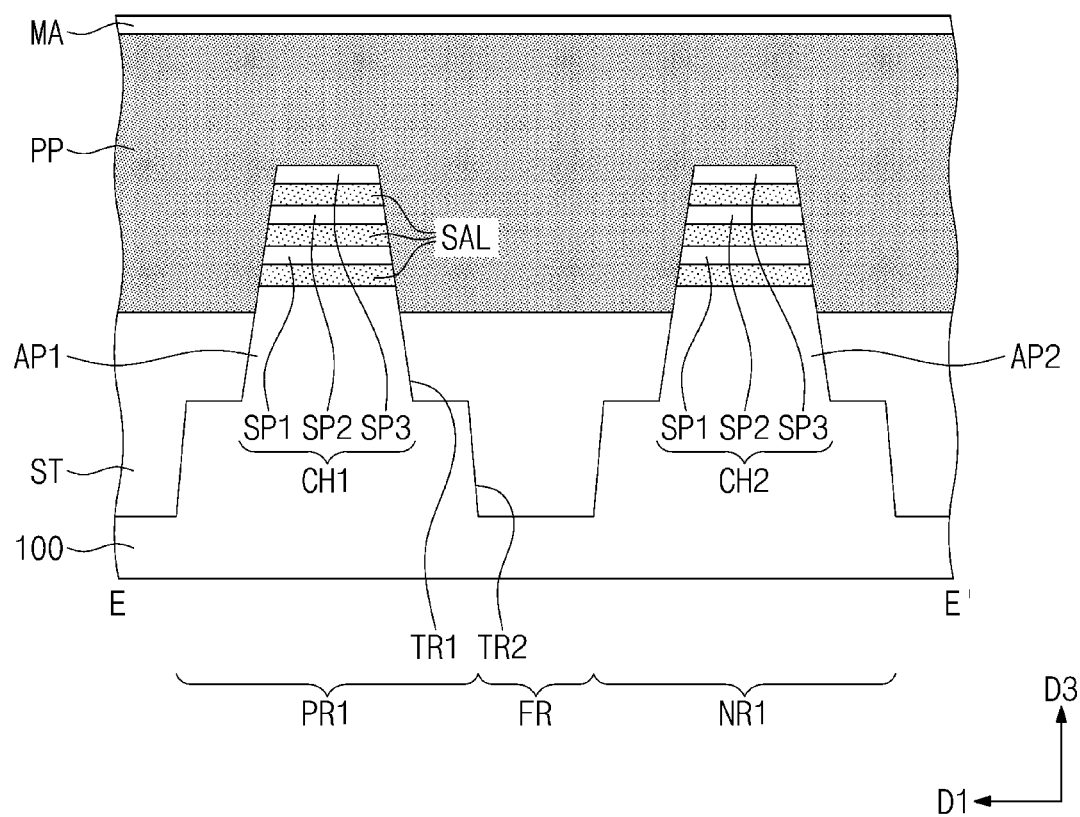
Figure 7A:
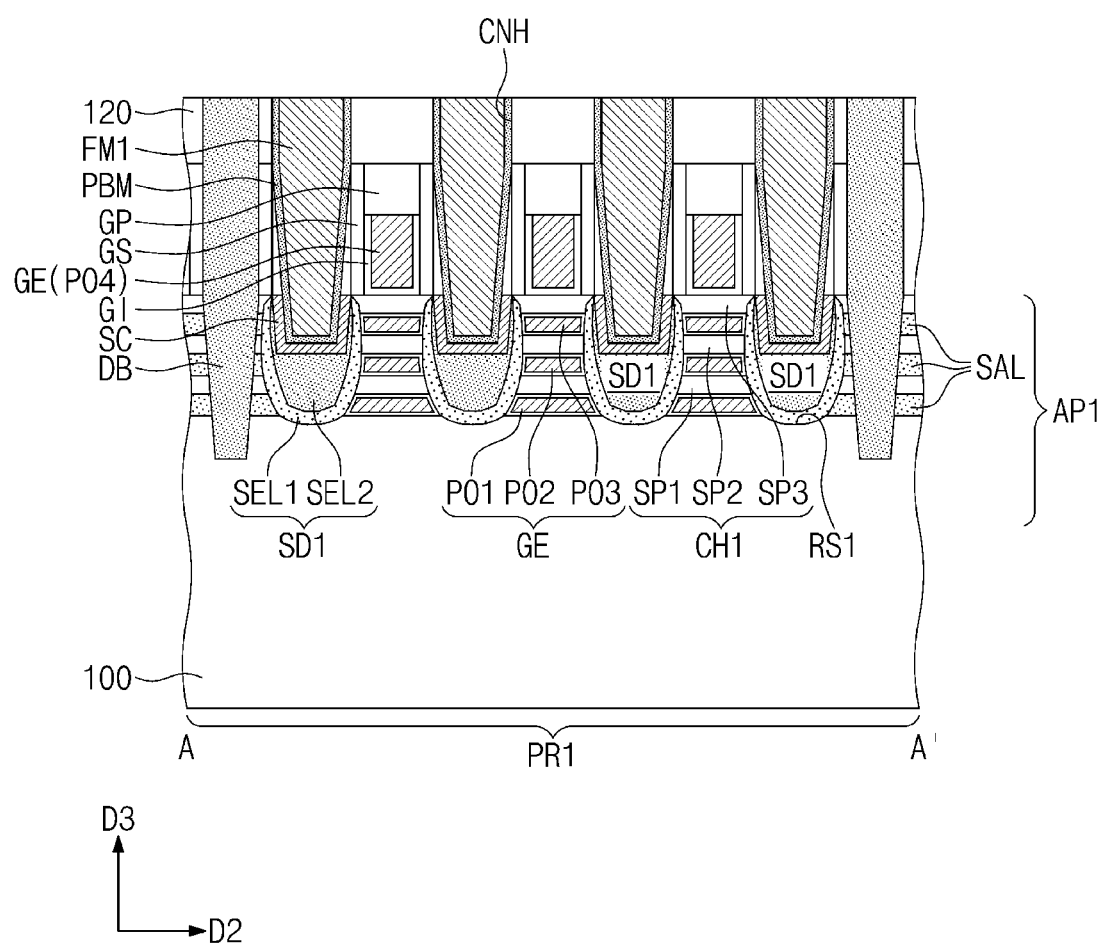
Figure 7B:
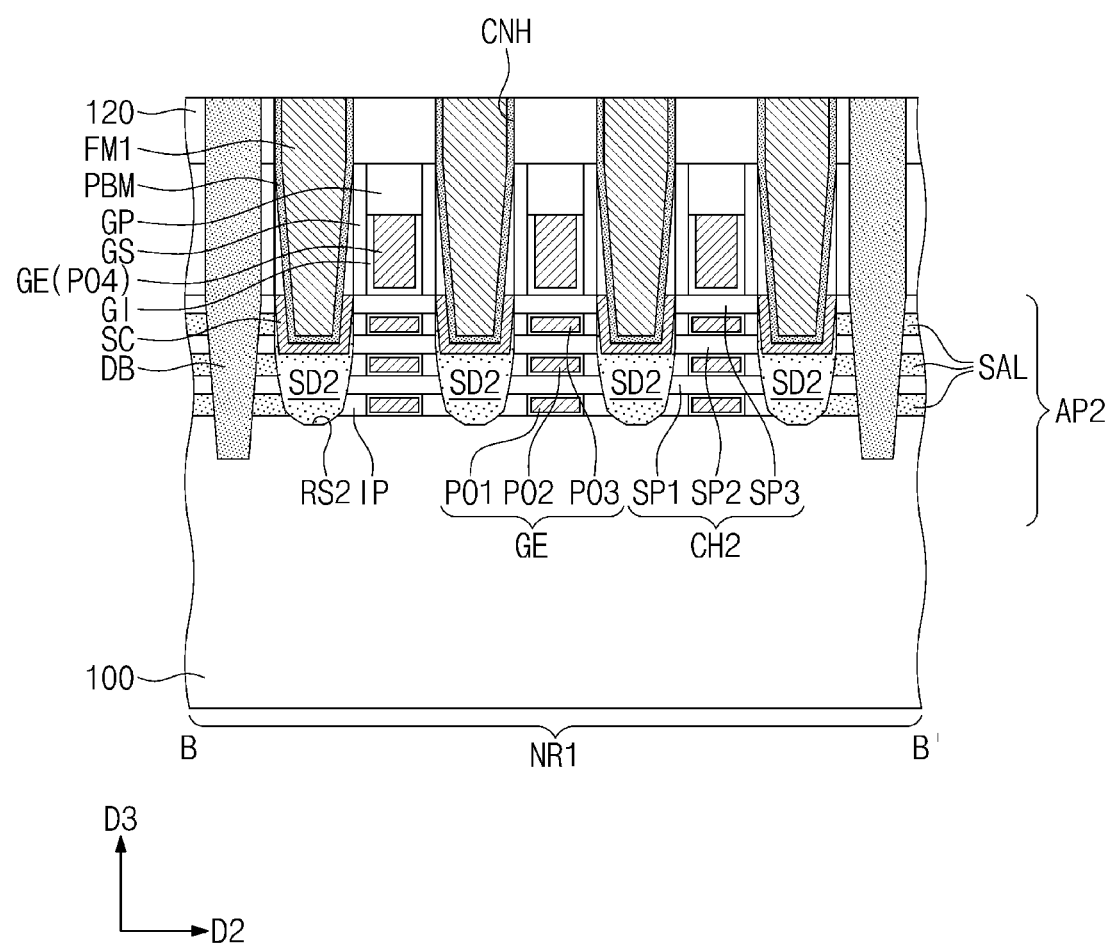
Figure 7C:
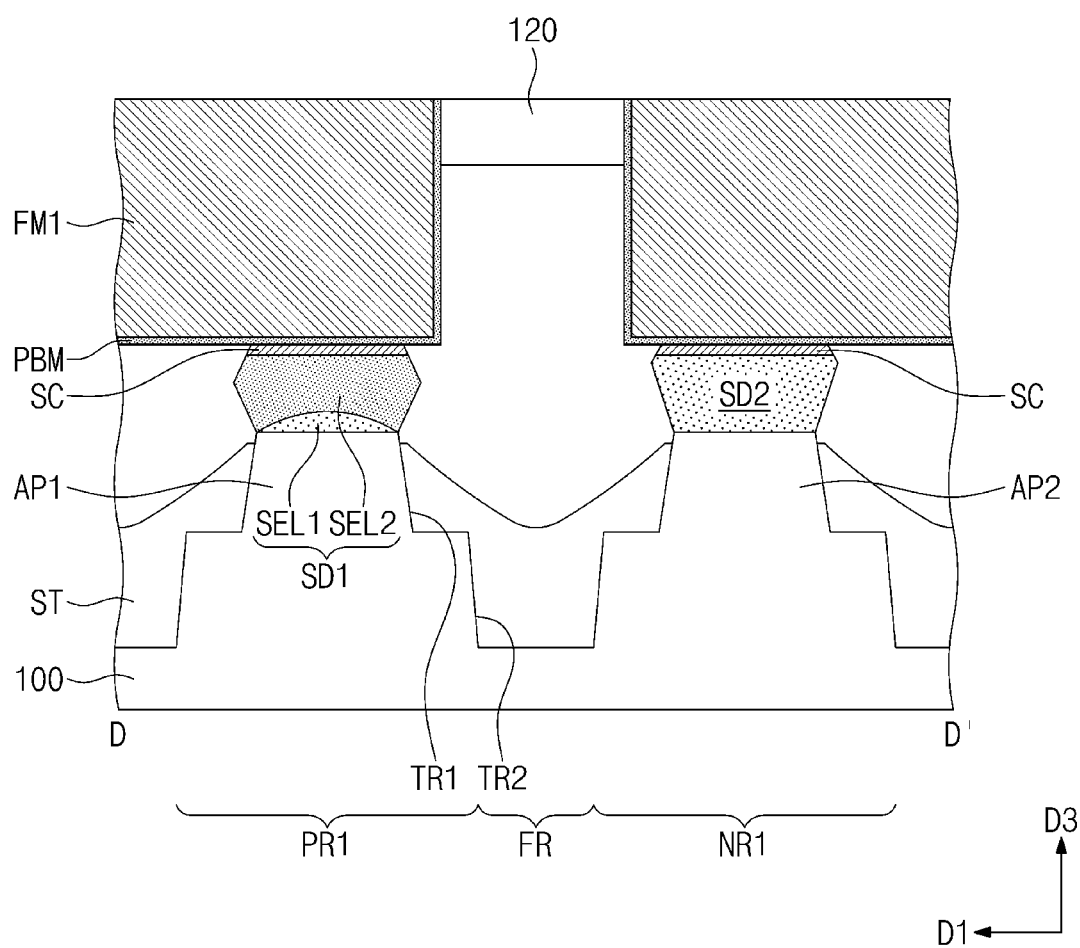
Figure 7D:
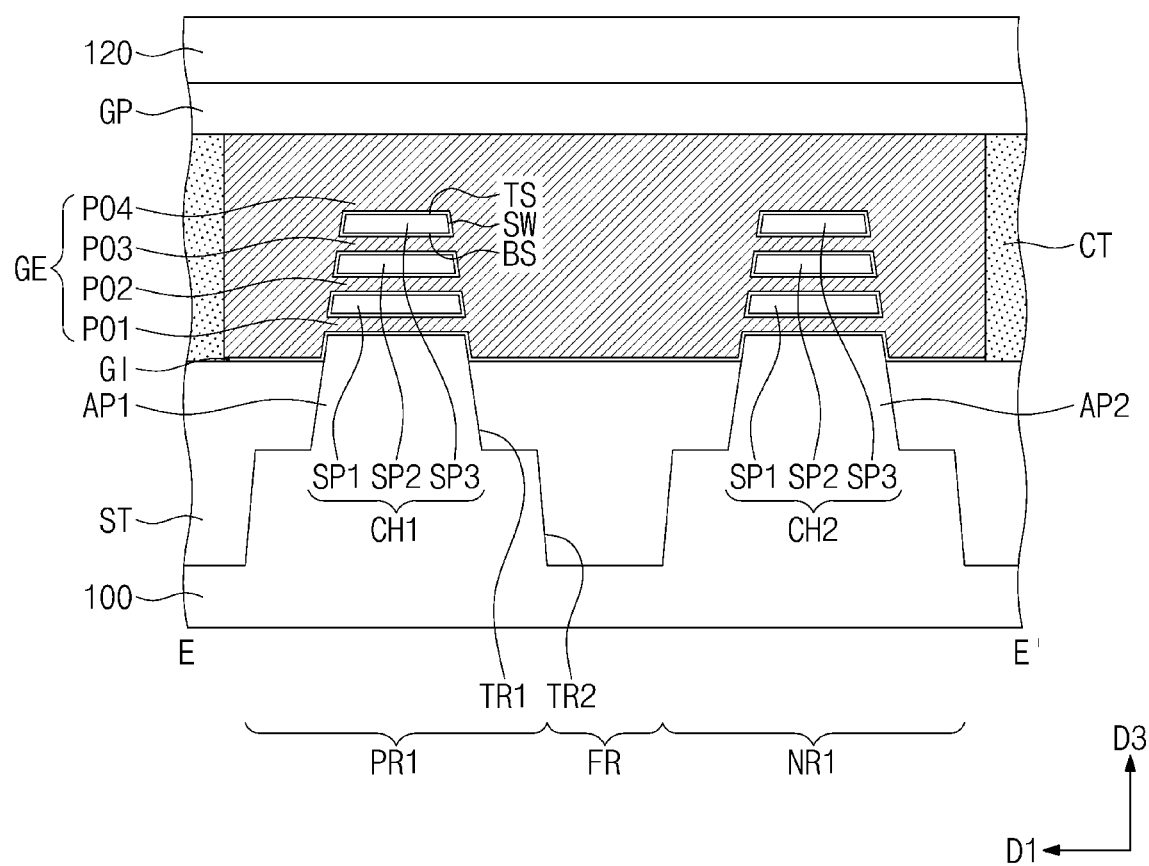
Figure 8A:
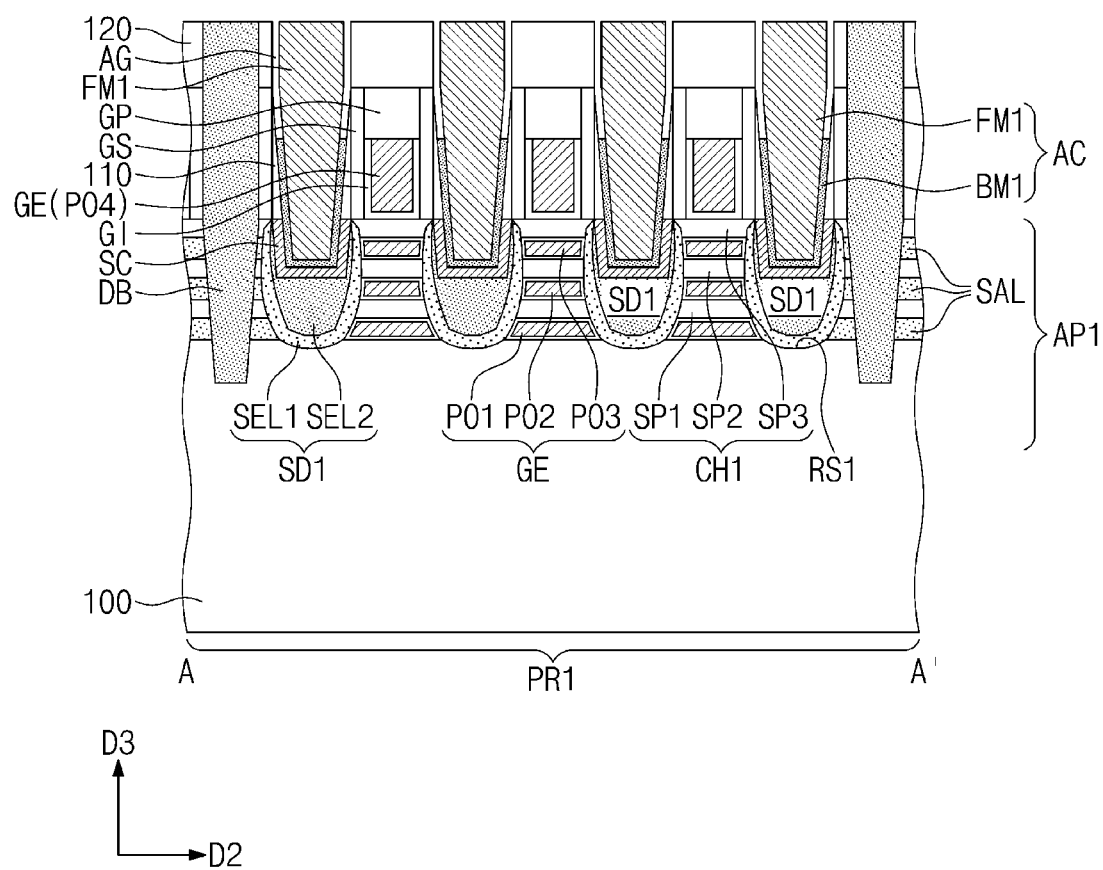
Figure 8B:
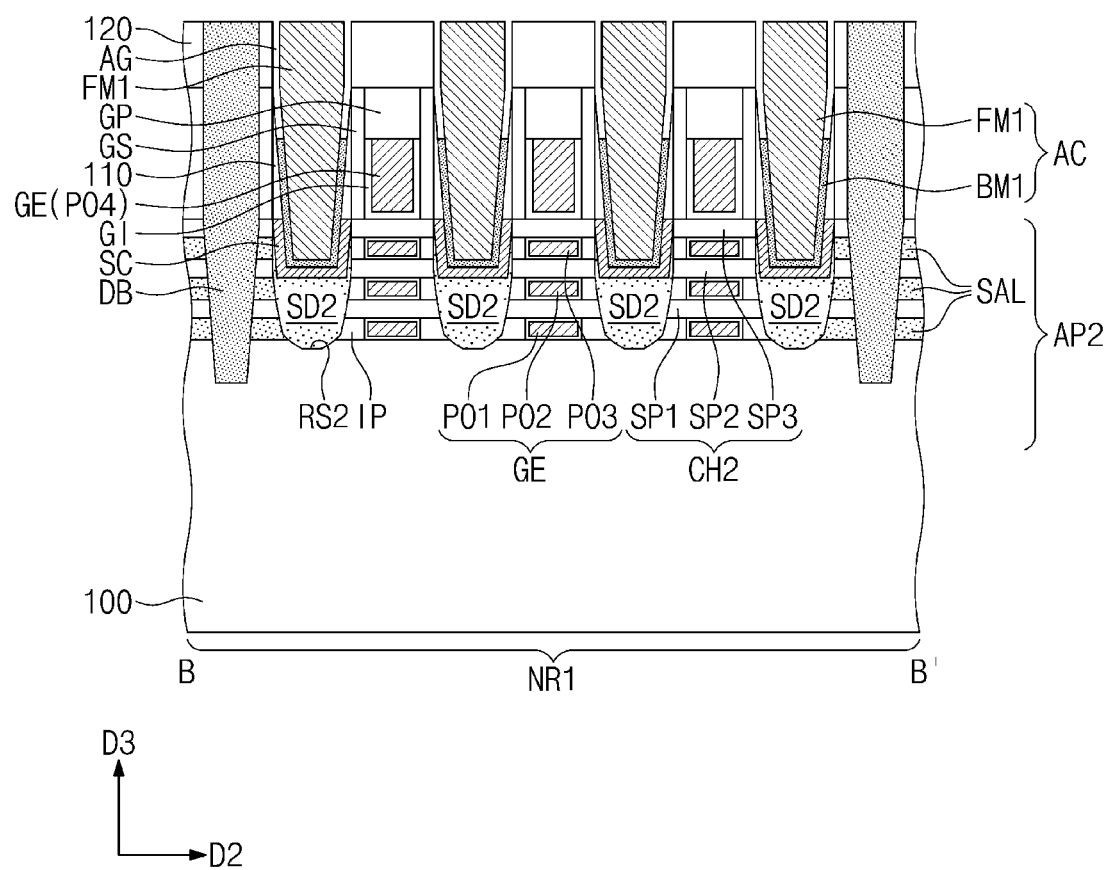
Figure 8C:
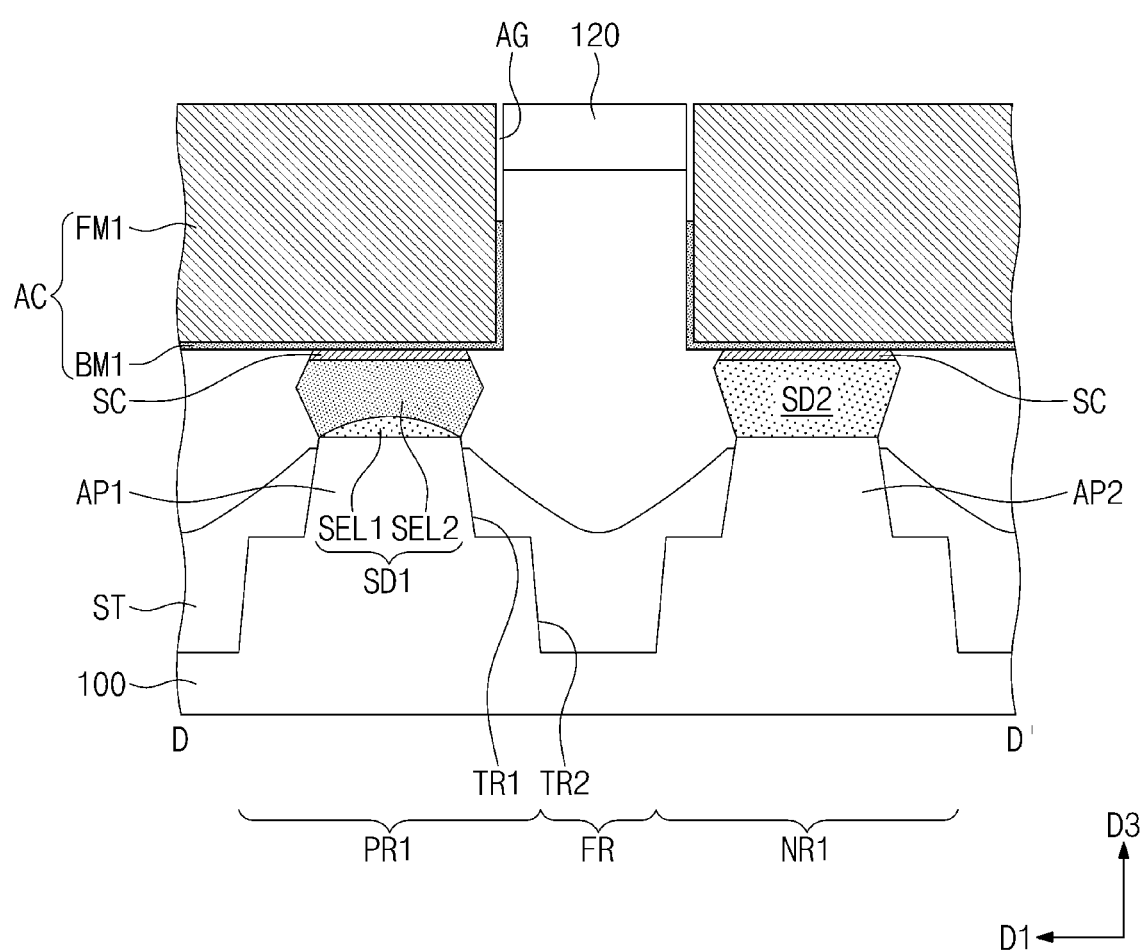
Figure 8D:
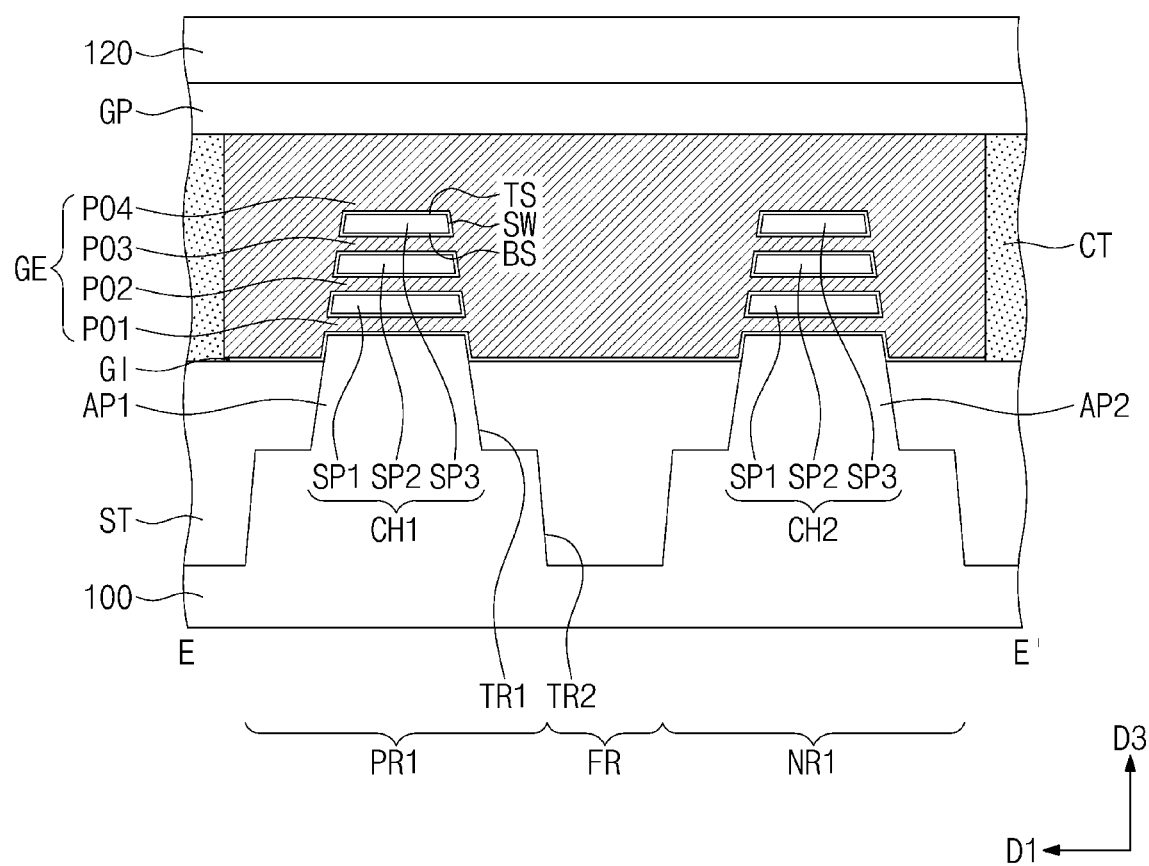
Figure 9A:
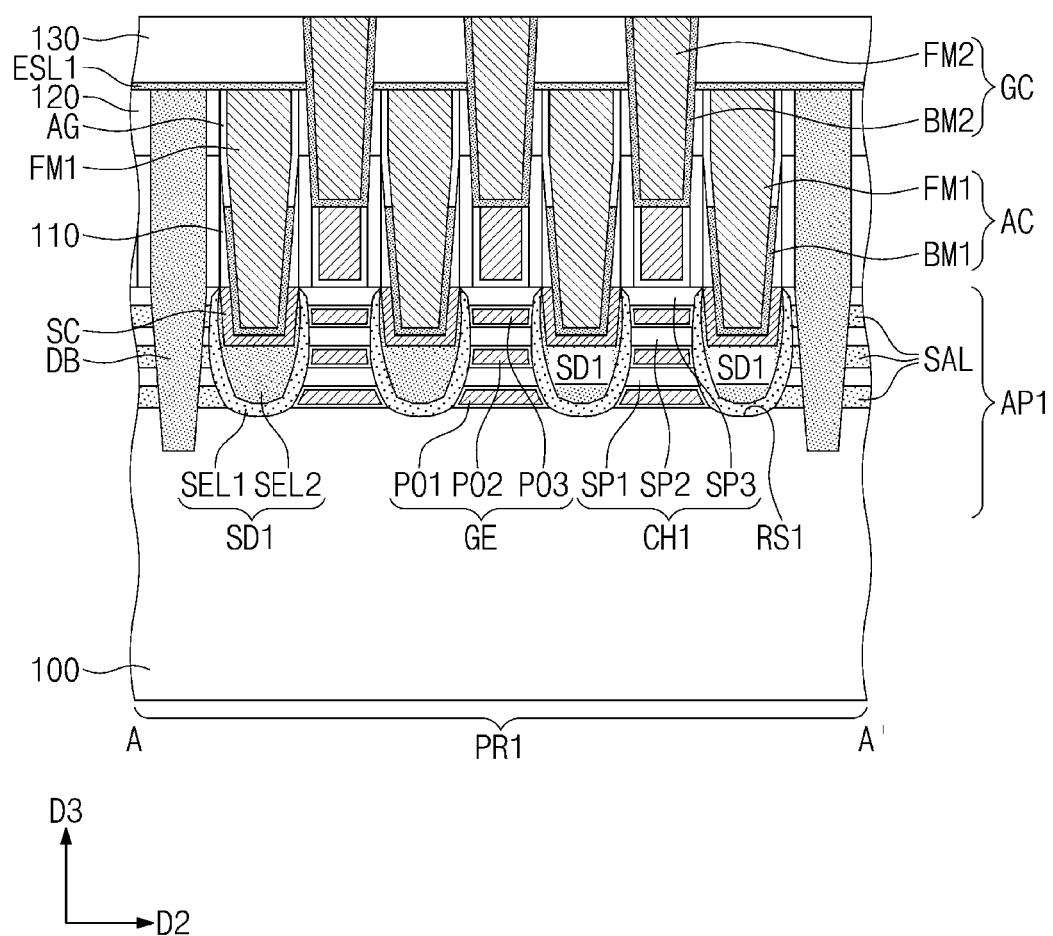
Figure 9B:
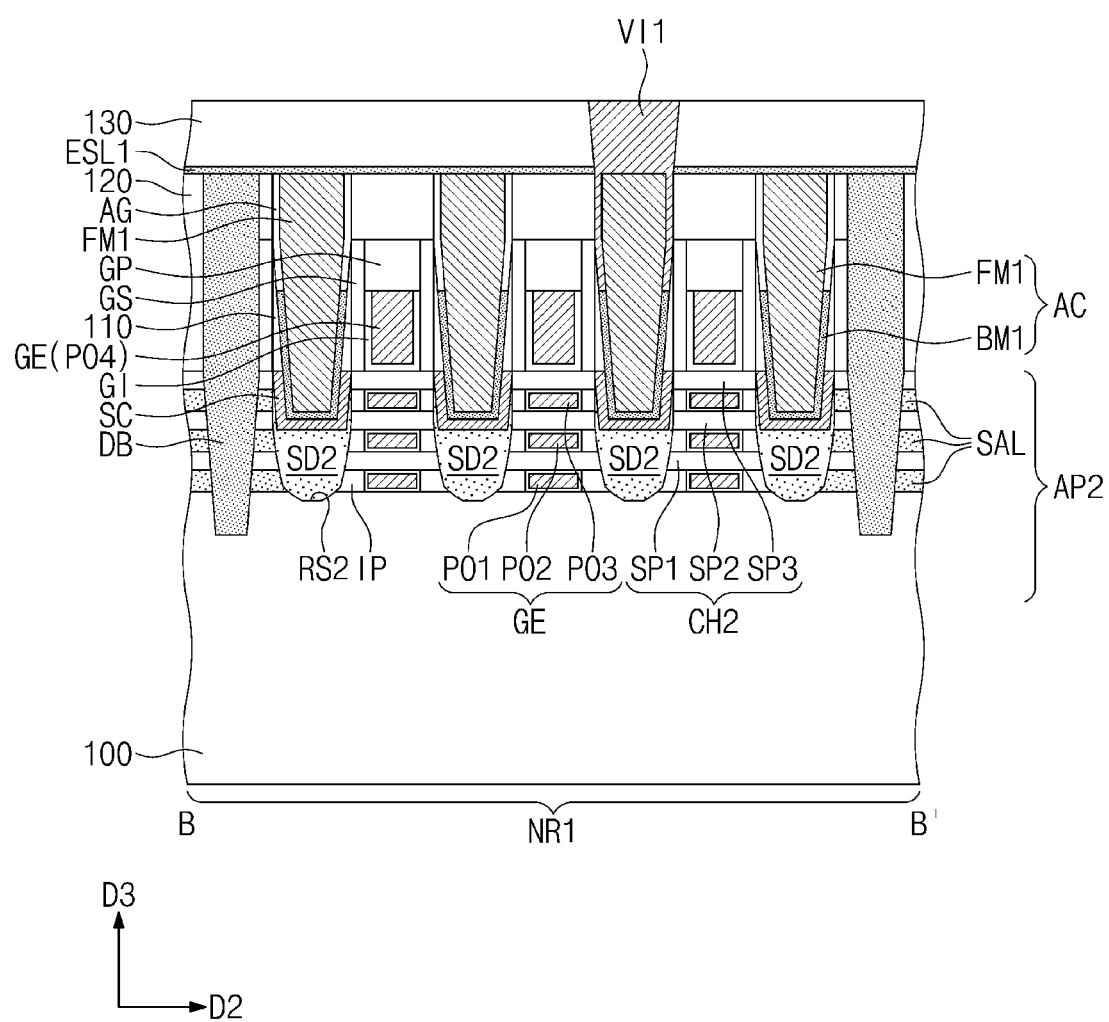
Figure 9C:
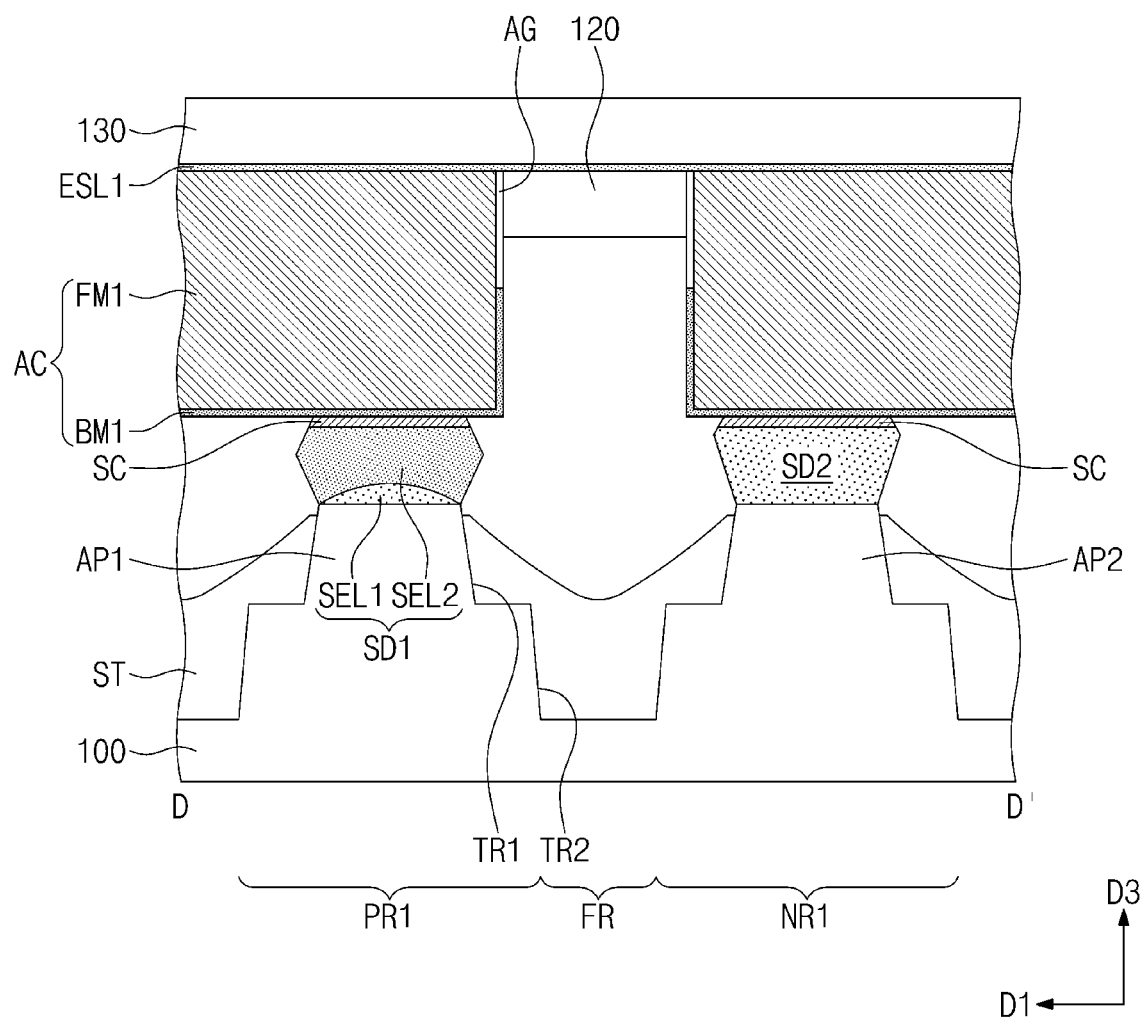
Figure 9D:
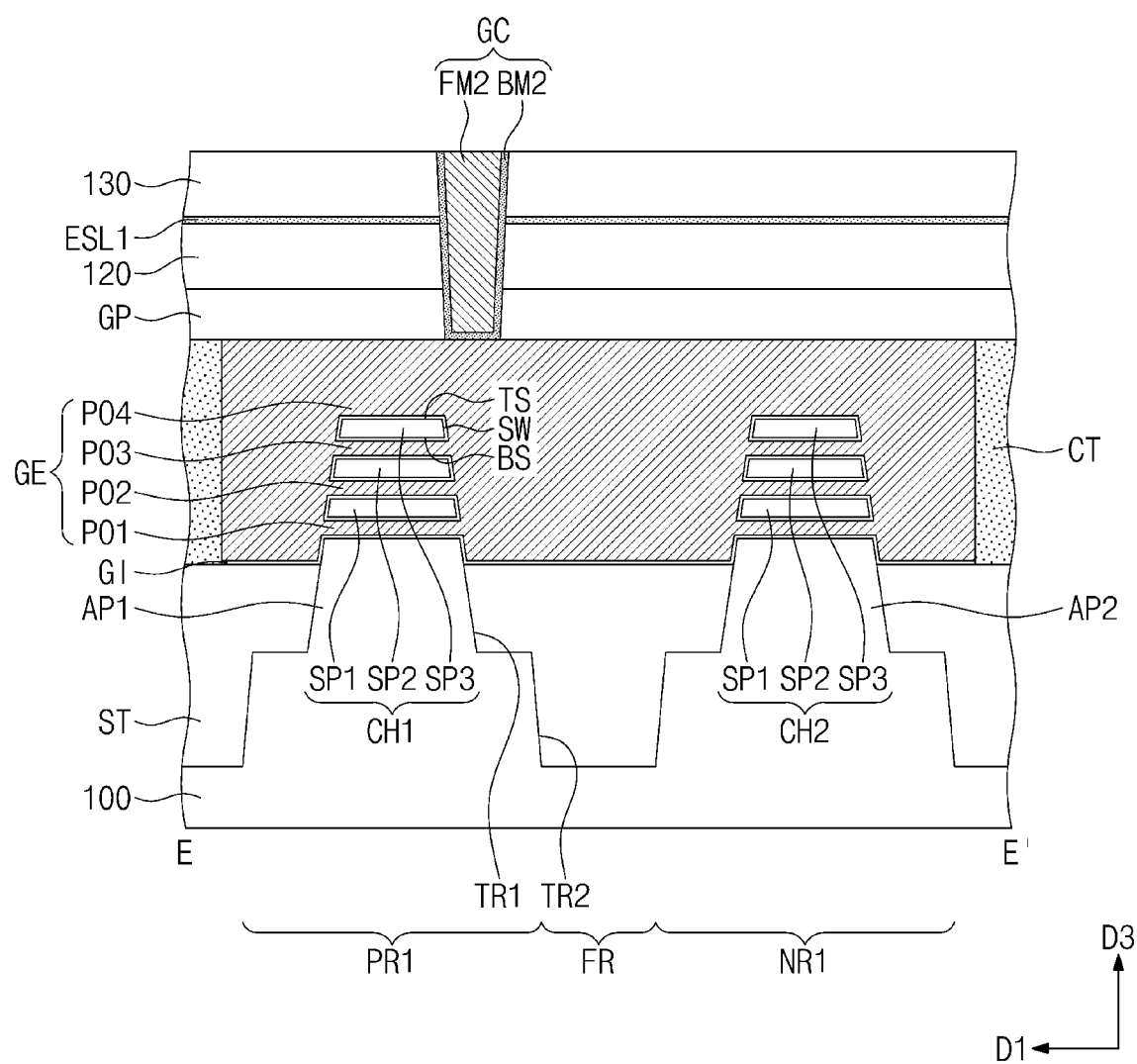

Referring to FIGS. 5A and 5B, sacrificial patterns PP may be formed to cross the first and second active patterns AP1 and AP2. The sacrificial patterns PP may be formed to have a line or bar shape extending in the first direction D1. The sacrificial patterns PP may be formed such that they are arranged in the second direction D2 and are spaced apart from each other at a constant pitch in the second direction D2.

For example, the formation of the sacrificial patterns PP may include forming a sacrificial layer on the substrate 100, forming hard mask patterns MA on the sacrificial layer, and pattering the sacrificial layer using the hard mask patterns MA as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

Referring to FIGS. 6A to 6D, the first recesses RS1 may be formed in the upper portion of the first active pattern AP1. The second recesses RS2 may be formed in the upper portions of the second active pattern AP2. During the formation of the first and second recesses RS1 and RS2, the device isolation layer ST may be recessed at both sides of each of the first and second active patterns AP1 and AP2 (e.g., see FIG. 6C).

For example, the first recesses RS1 may be formed by etching upper portions of the first active pattern AP1 using the hard mask patterns MA and the gate spacers GS as an etch mask. The first recess RS1 may be formed between a pair of the sacrificial patterns PP. The second recesses RS2 in the upper portion of the second active pattern AP2 may be formed by the same method as that for the first recesses RS1.

The first source/drain patterns SD1 may be formed in the first recesses RS1, respectively. For example, the first semiconductor layer SEL1 may be formed by performing a first SEG process using an inner surface of the first recess RS1 as a seed layer. The first semiconductor layer SEL1 may be grown using the first to third semiconductor patterns SP1, SP2, and SP3 and the substrate 100, which are exposed through the first recesses RS1, as a seed. As an example, the first SEG process may include or may be a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In another embodiment, the first semiconductor layer SEL1 may be provided to contain only silicon (Si) but not germanium (Ge). The germanium concentration of the first semiconductor layer SEL1 may range from 0 at % to 10 at %.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high germanium concentration. For example, the second semiconductor layer SEL2 may have a higher germanium concentration than the first semiconductor layer SELL As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, impurities may be injected into the first source/drain pattern SD1, after the formation of the first source/drain pattern SD1. The first source/drain pattern SD1 may be doped to have a first conductivity type (e.g., a p-type).

The second source/drain patterns SD2 may be formed in the second recesses RS2, respectively. For example, the second source/drain pattern SD2 may be formed by a SEG process using an inner surface of the second recesses RS2 as a seed layer. In an embodiment, the second source/drain pattern SD2 may be formed of or include the same semiconductor material (e.g., Si) as the substrate 100. The second source/drain pattern SD2 may be doped to have a second conductivity type (e.g., n-type). The inner spacers IP may be respectively formed between the second source/drain pattern SD2 and the sacrificial layers SAL.

Referring to FIGS. 7A to 7D, the first interlayer insulating layer 110 may be formed to cover the first and second source/drain patterns SD1 and SD2, the hard mask patterns MA, and the gate spacers GS. As an example, the first interlayer insulating layer 110 may include or may be a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. In an embodiment, the planarization process may be performed to remove all of the hard mask patterns MA. Accordingly, the first interlayered insulating layer 110 may have a top surface that is coplanar with the top surfaces of the sacrificial patterns PP and the top surfaces of the gate spacers GS. For example, some upper portions of the sacrificial patterns PP and/or some upper portions of the gate spacers GS may be removed by the planarization process.

In an embodiment, the exposed sacrificial patterns PP may be selectively removed. Since the sacrificial patterns PP are removed, first empty spaces may be formed to expose the first and second active patterns AP1 and AP2. Some of the sacrificial patterns PP may not be removed. For example, by forming a mask layer on the sacrificial patterns PP that should not be removed, it may be possible to prevent the unintended ones of the sacrificial patterns PP from being removed. The sacrificial layers SAL of each of the first and second active patterns AP1 and AP2 may be exposed through the first empty spaces.

The exposed sacrificial layers SAL may be selectively removed through the first empty spaces. For example, by performing a process of selectively etching the sacrificial layers SAL, the first to third semiconductor patterns SP1, SP2, and SP3 may remain and only the sacrificial layers SAL may be removed. The etching process may be chosen to exhibit a high etch rate for a material (e.g., SiGe) having a relatively high germanium concentration. For example, the etching process may have a high etch rate for silicon-germanium whose germanium concentration is higher than 10 at %.

The sacrificial layers SAL on the first PMOSFET region PR1, the second PMOSFET region PR2, the first NMOSFET region NR1, and the second NMOSFET region NR2 may be removed during the etching process. The etching process may be a wet etching process. An etchant material, which is used in the etching process, may be chosen to quickly remove the sacrificial layer SAL having a relatively high germanium concentration. Meanwhile, the first source/drain pattern SD1 on the first and second PMOSFET regions PR1 and PR2 may be protected from the etching process by the first semiconductor layer SEL1 having a relatively low germanium concentration.

Since the sacrificial layers SAL are selectively removed, only the first to third semiconductor patterns SP1, SP2, and SP3 may be left on each of the first and second active patterns AP1 and AP2. Second empty spaces may be formed through empty regions, which are formed by removing the sacrificial layers SAL. The second empty spaces may be defined between the first to third semiconductor patterns SP1, SP2, and SP3.

The gate insulating layer GI may be conformally formed in the first and second empty spaces. The gate electrode GE may be formed on the gate insulating layer GI. The gate electrode GE may be formed to fill the first and second empty spaces. For example, the gate electrode GE may include the first to third portions PO1, PO2, and PO3 filling the second empty spaces. The gate electrode GE may further include the fourth portion PO4 filling the first empty space. The gate cutting pattern CT may be formed to penetrate the gate electrode GE. The gate capping pattern GP may be formed on the gate electrode GE.

The second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The formation of the active contacts AC may include forming a contact hole CNH to penetrate the second interlayer insulating layer 120 and the first interlayer insulating layer 110, forming a preliminary barrier pattern PBM to conformally cover an inner surface of the contact hole CNH, and forming the first conductive pattern FM1 to fill a remaining portion of the contact hole CNH.

The division structure DB may be formed to penetrate the second interlayer insulating layer 120, the remaining sacrificial pattern PP, and an upper portion of the active pattern AP1 or AP2 below the sacrificial pattern PP. The division structure DB may be formed of or include an insulating material (e.g., silicon oxide or silicon nitride).

Referring to FIGS. 8A to 8D, the air gap AG, which is adjacent to or placed on the first conductive pattern FM1, may be formed by etching an upper portion of the preliminary barrier pattern PBM. In an embodiment, the air gap AG may be formed by a dry etching process, which is performed to selectively etch the preliminary barrier pattern PBM. Since the upper portion of the preliminary barrier pattern PBM is etched, the first barrier pattern BM1 may be formed to enclose and contact a bottom surface and a portion of a side surface of the first conductive pattern FM1. The top surface of the first barrier pattern BM1 may be located at a level lower than the top surface of the first conductive pattern FM1.

Referring to FIGS. 9A to 9D, the first etch stop layer ESL1 may be formed to cover/contact the second interlayer insulating layer 120. In an embodiment, the first etch stop layer ESL1 may be formed using a deposition process (e.g., a PECVD process) capable of providing a poor step coverage property. Accordingly, the first etch stop layer ESL1 may not be formed in the air gap AG. The third interlayer insulating layer 130 may be formed on the first etch stop layer ESL1.

The lower vias VI1 may be formed to penetrate the third interlayer insulating layer 130 and the first etch stop layer ESL1 and to be electrically connected to the active contacts AC. The lower vias VI1 may fill a portion of the air gap AG. The lower via VI1 may be in contact with the top surface of the first barrier pattern BM1.

The gate contact GC may be formed to penetrate the third interlayer insulating layer 130 and the first etch stop layer ESL1 and to be electrically connected to the gate electrode GE. The air gap AG may be adjacent to the gate contact GC in the second direction D2. The lower via VI1 may be offset from the gate contact GC in the first direction D1.

Referring back to FIGS. 1 and 2A to 2E, the fourth interlayer insulating layer 140 may be formed on the third interlayer insulating layer 130. The first and second lower interconnection lines M1_R and M1_I may be formed in the fourth interlayer insulating layer 140. As a result, the first metal layer M1 may be formed in the third and fourth interlayer insulating layers 130 and 140.

The second etch stop layer ESL2 may be formed to cover/contact the fourth interlayer insulating layer 140. The fifth interlayer insulating layer 150 may be formed on the second etch stop layer ESL2. The second metal layer M2 may be formed in the fifth interlayer insulating layer 150.

Figure 10:
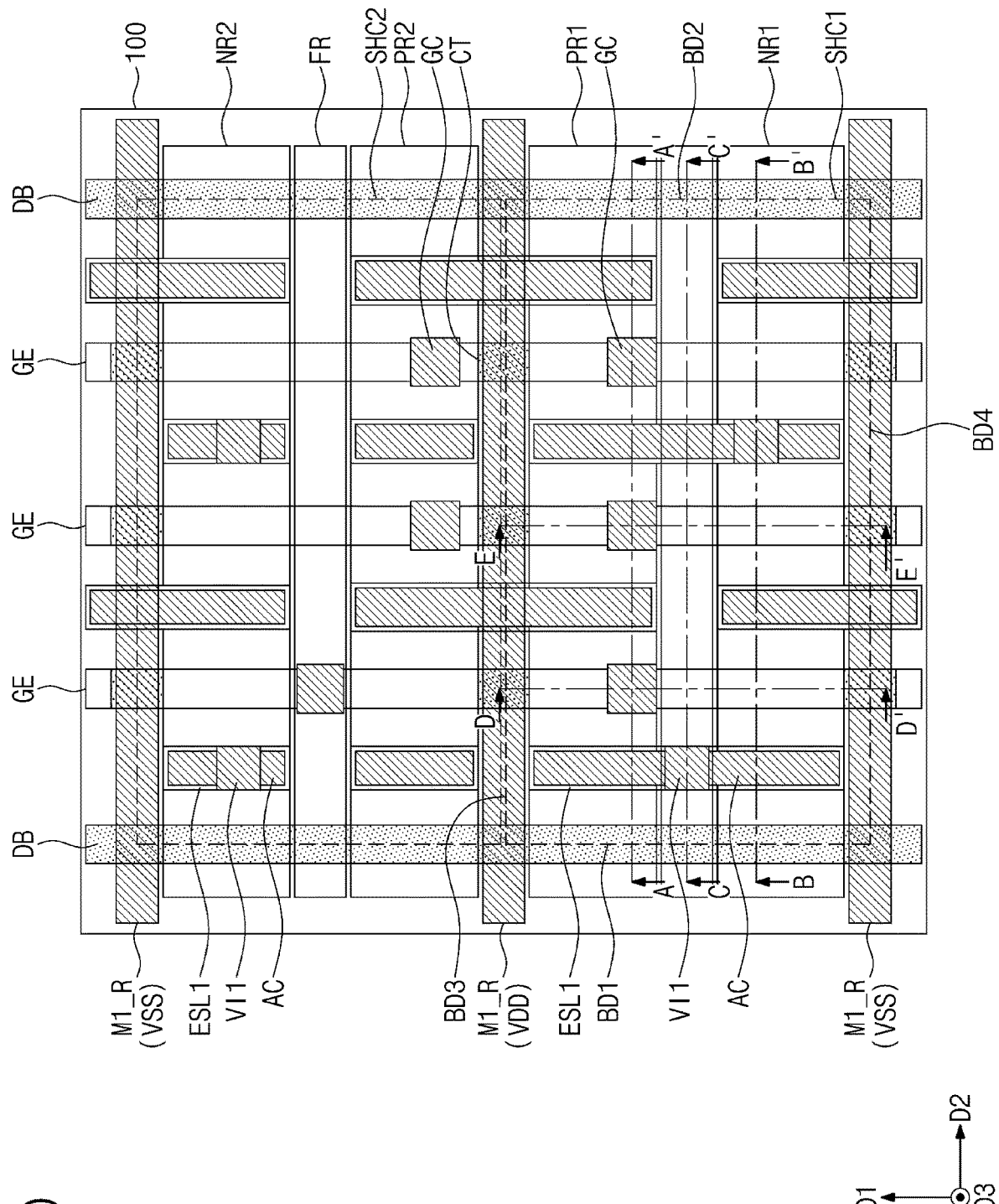
FIG. 10 is a plan view illustrating a semiconductor device according to an embodiment of the inventive concept.
Figure 11A:
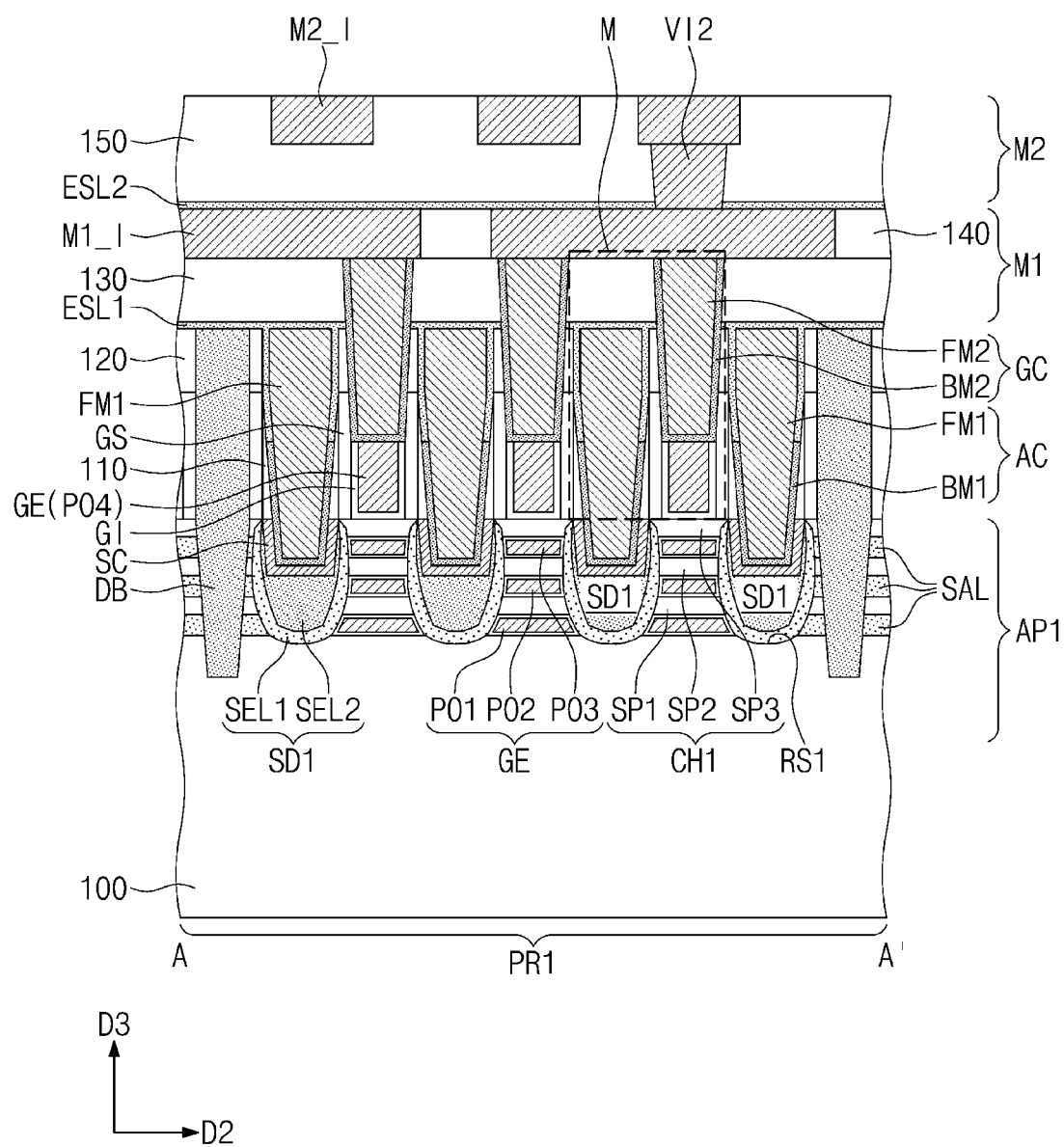
FIGS. 11A to 11D are sectional views which are taken along lines A-A', B-B', C-C', and D-D', respectively, of FIG. 10.
Figure 11B:
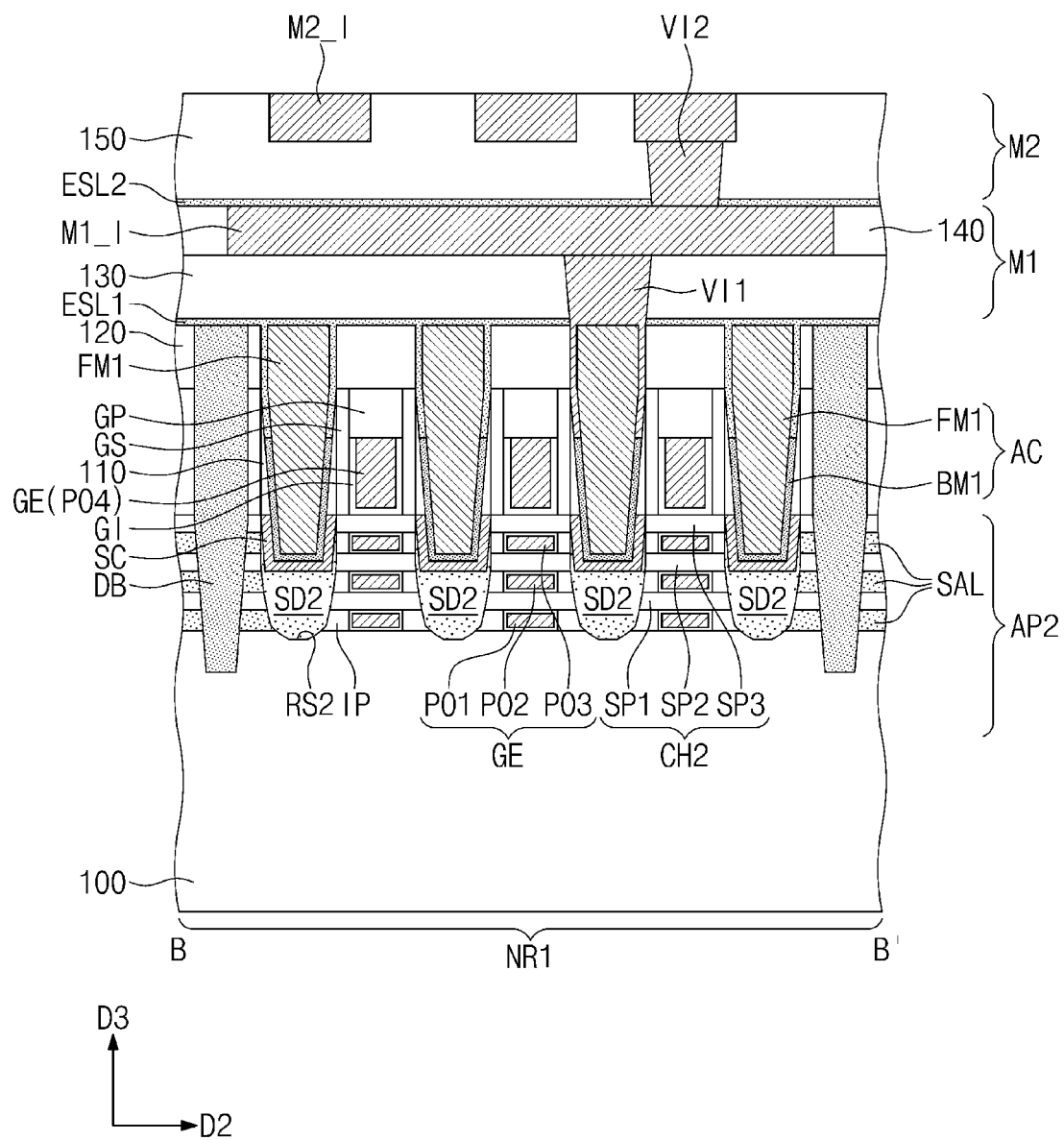
Figure 11C:
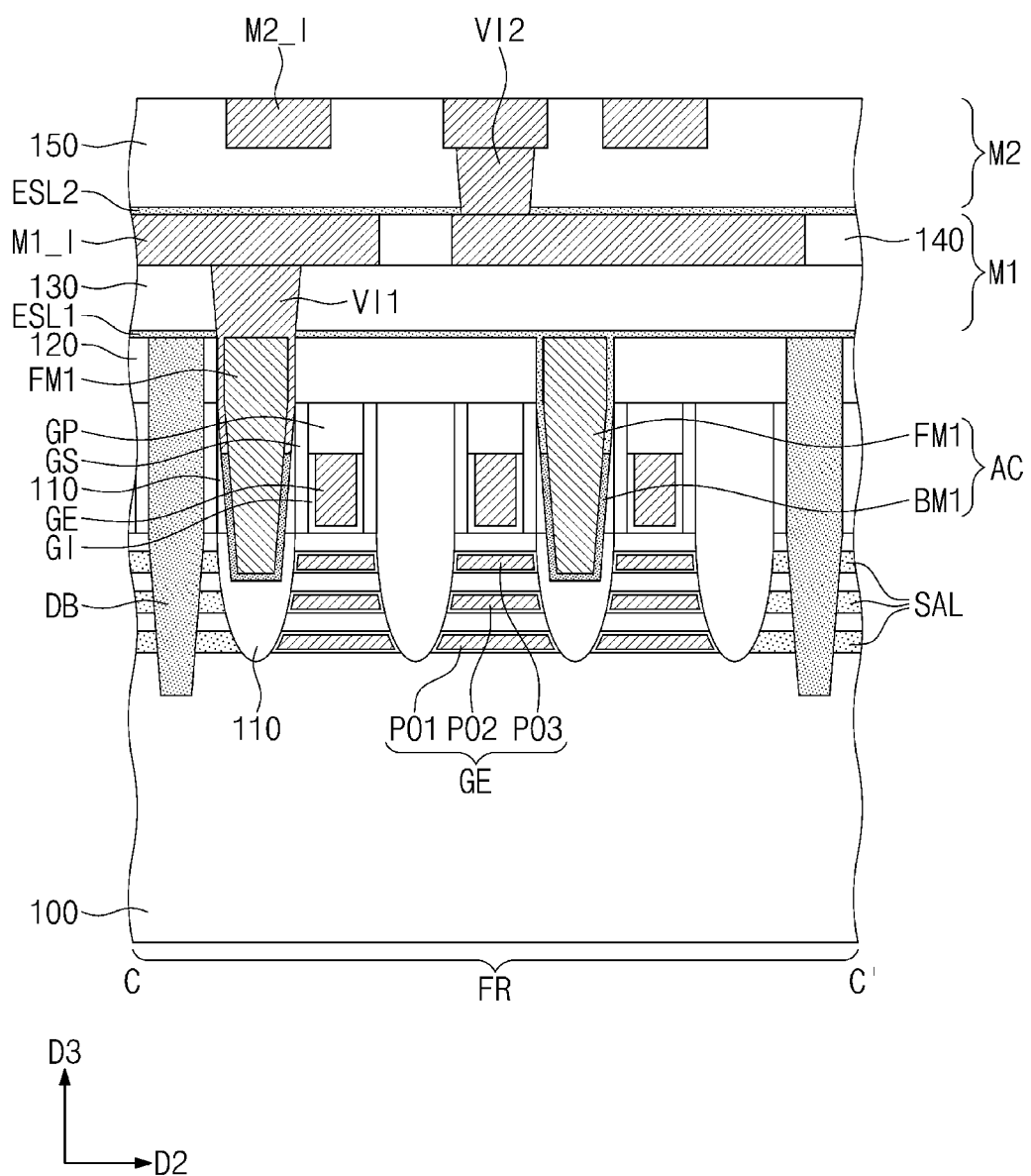
Figure 11D:
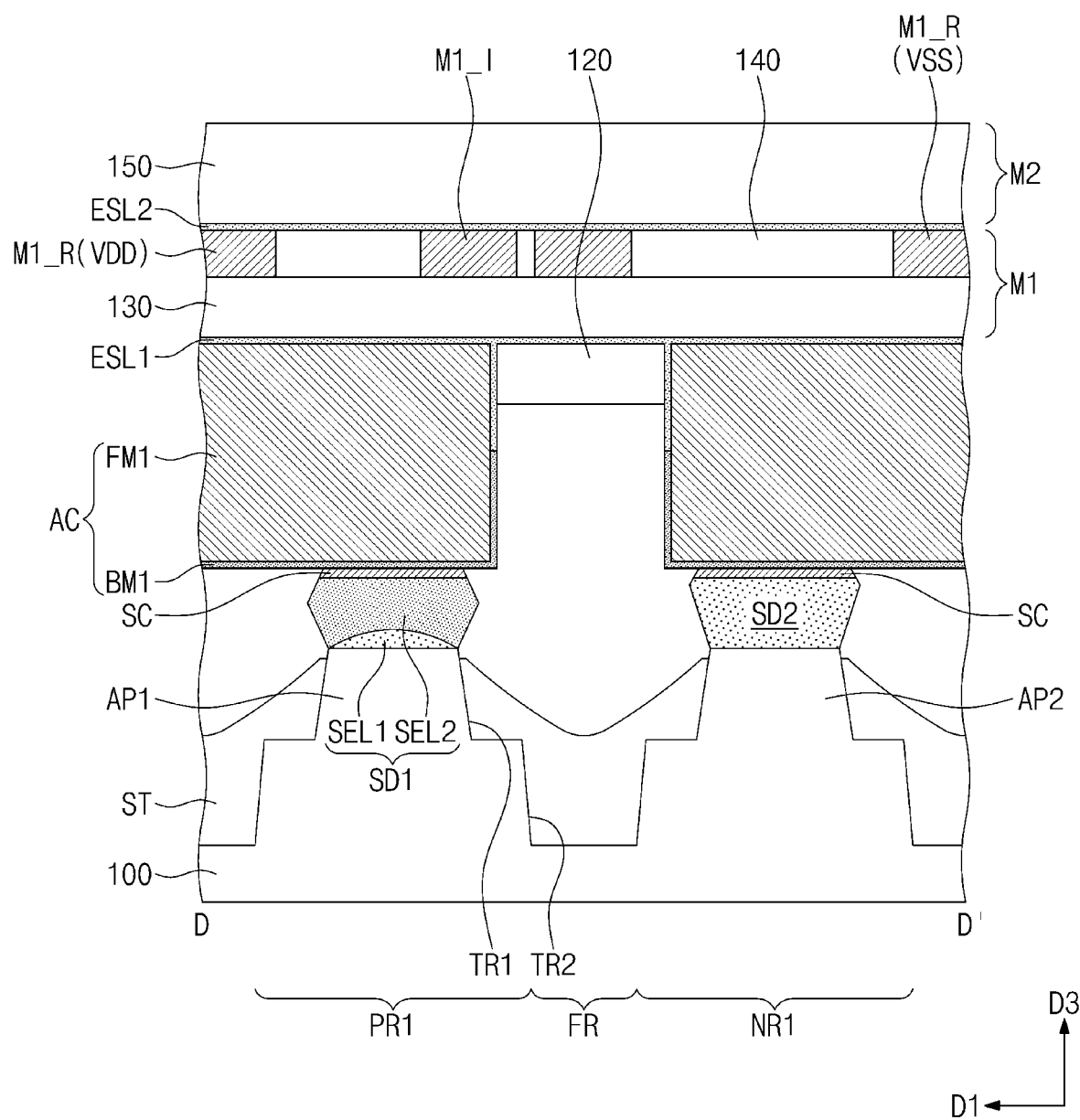
Figure 12:
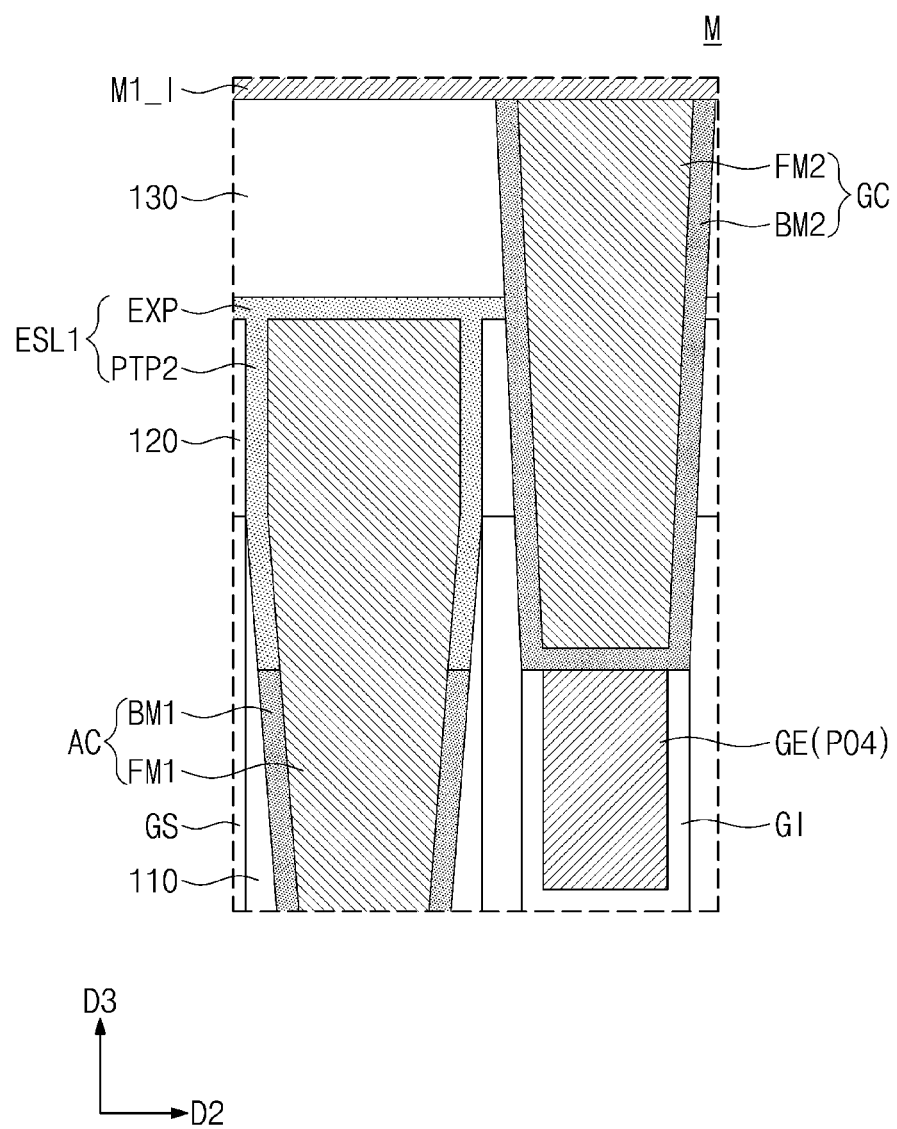
FIG. 12 is an enlarged sectional view illustrating a portion 'M' of FIG. 11A.
Figure 13A:
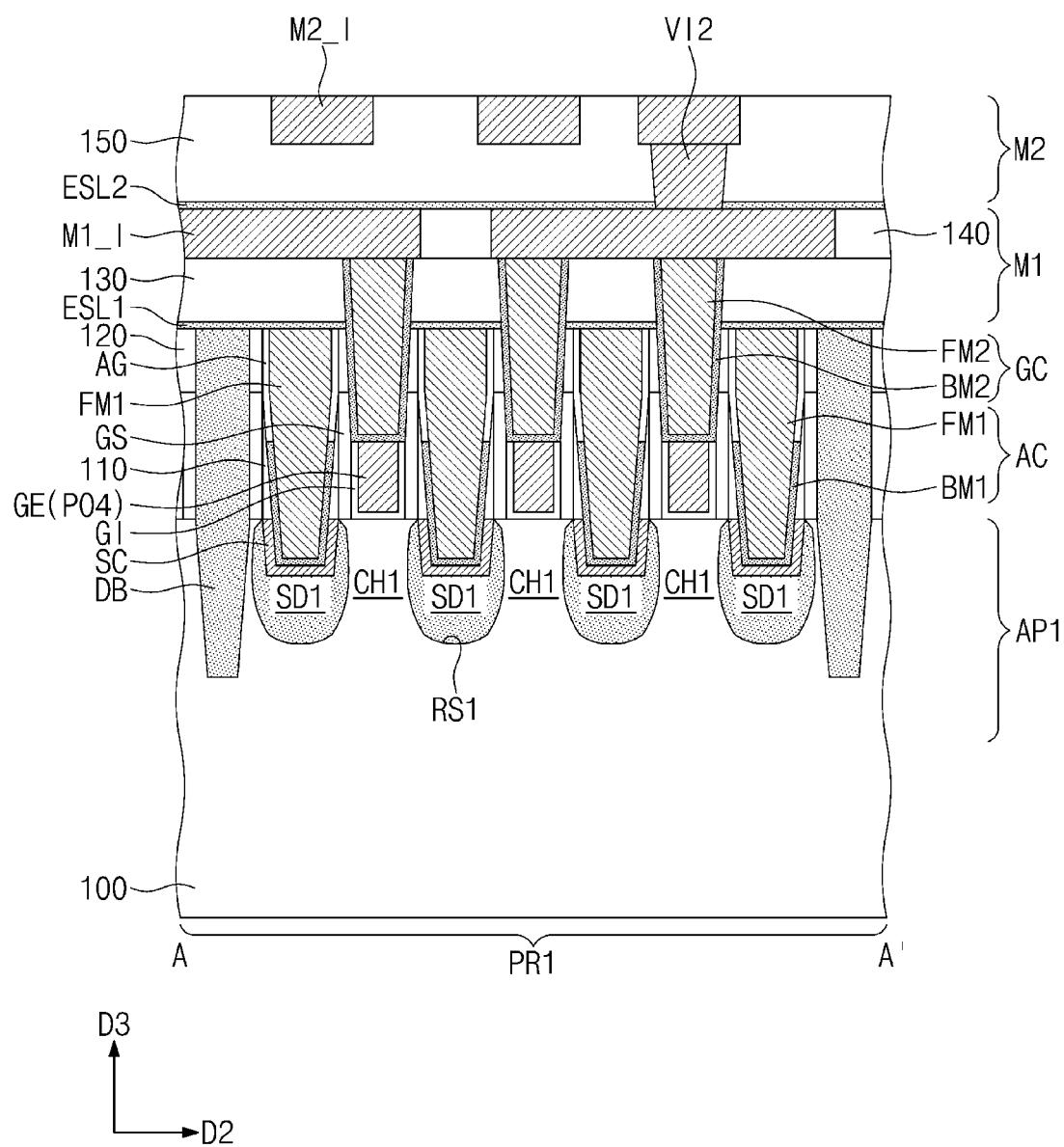
FIGS. 13A to 13E are sectional views which are taken along lines A-A', B-B', C-C', D-D', and E-E', respectively, of FIG. 1 to illustrate a semiconductor device according to an embodiment of the inventive concept.
Figure 13B:
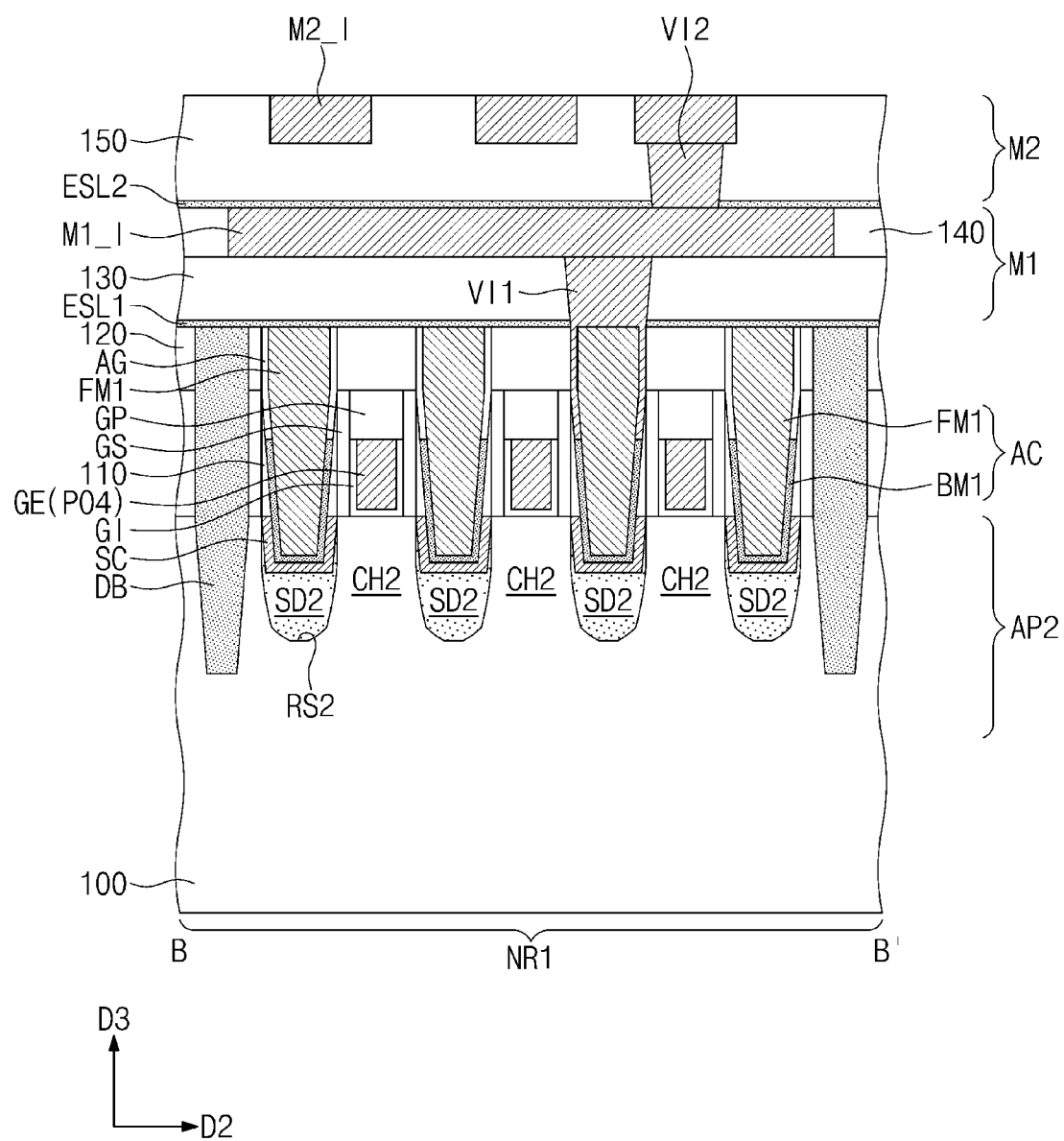
Figure 13C:
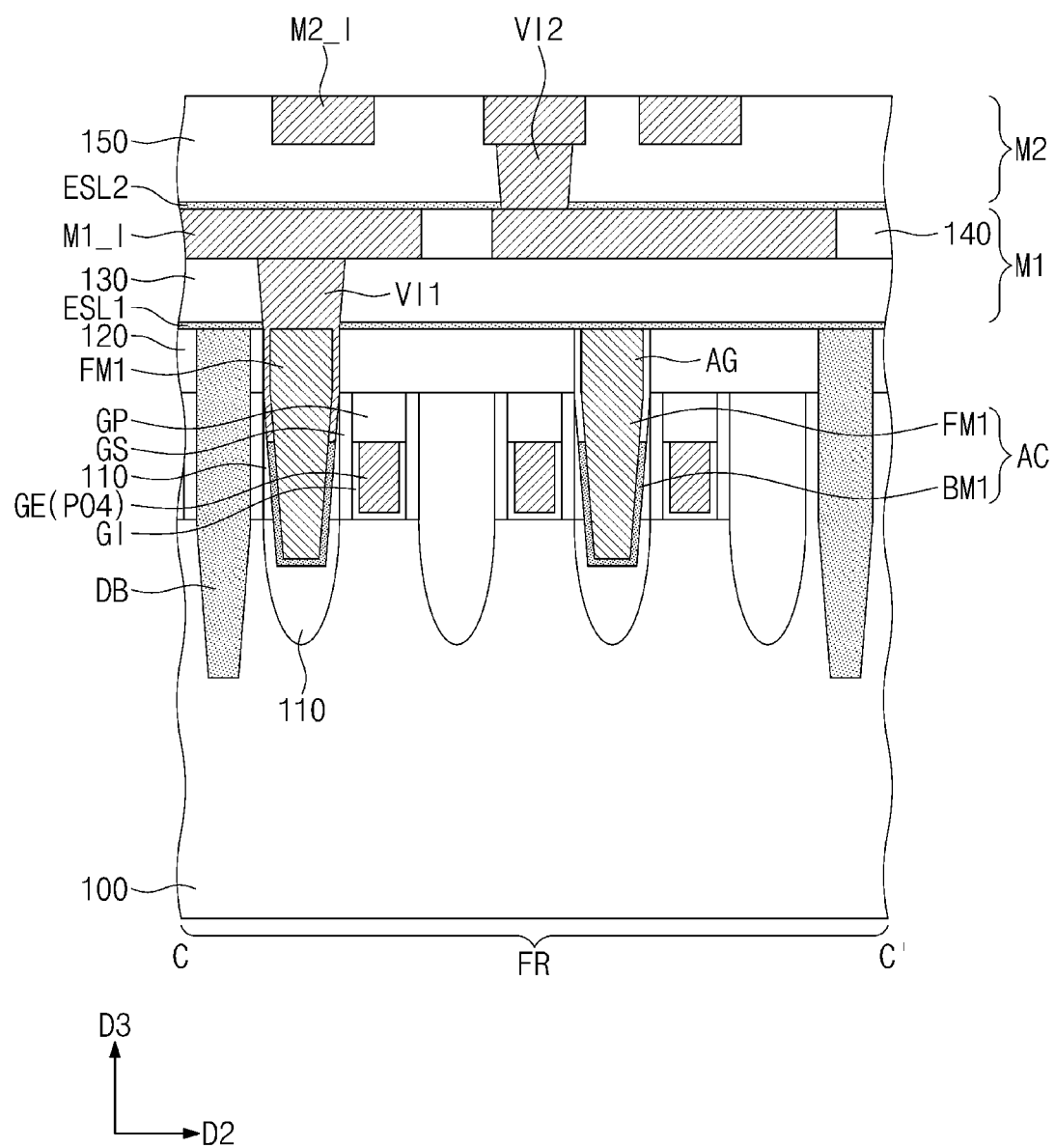
Figure 13D:
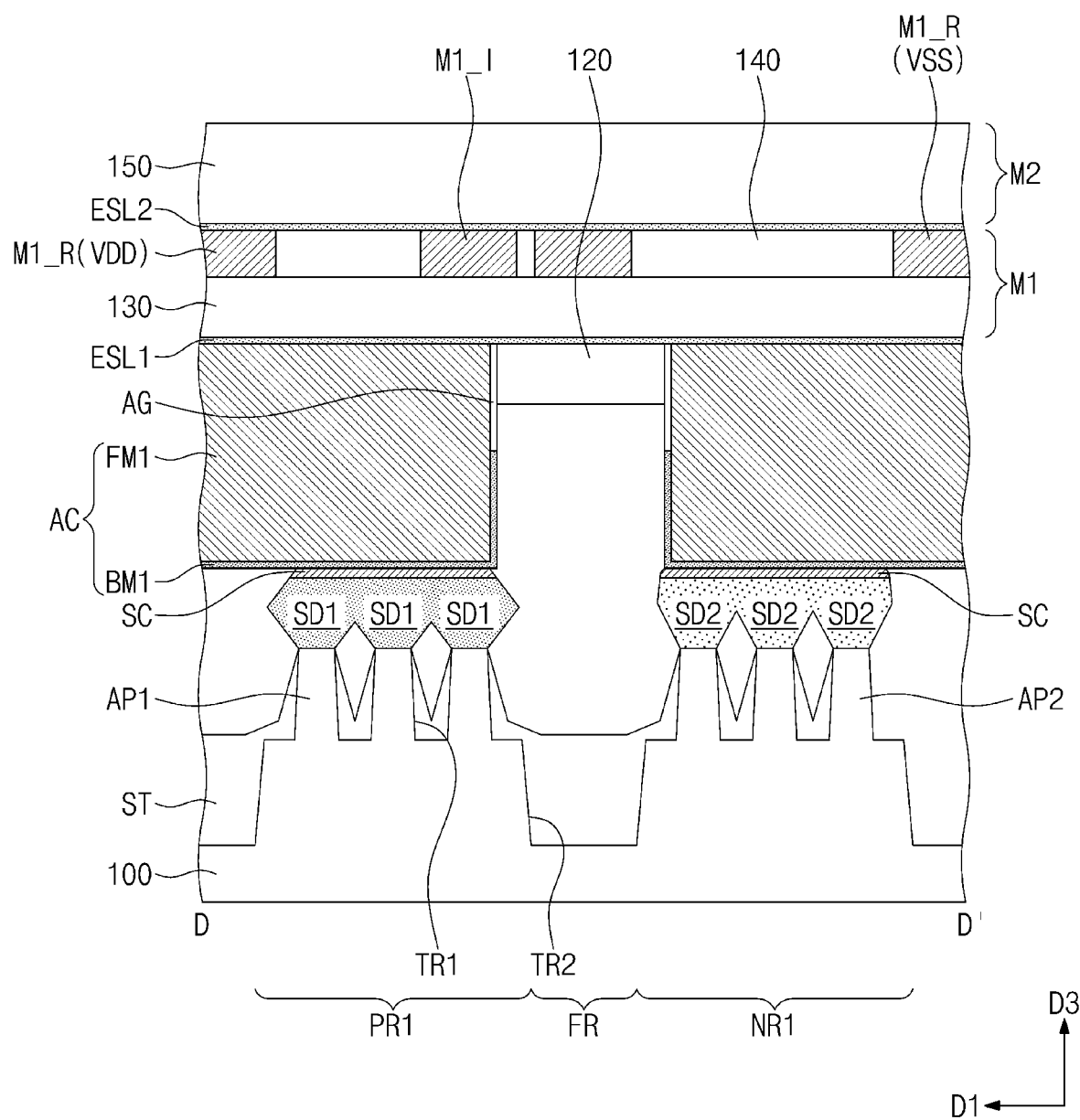
Figure 13E:
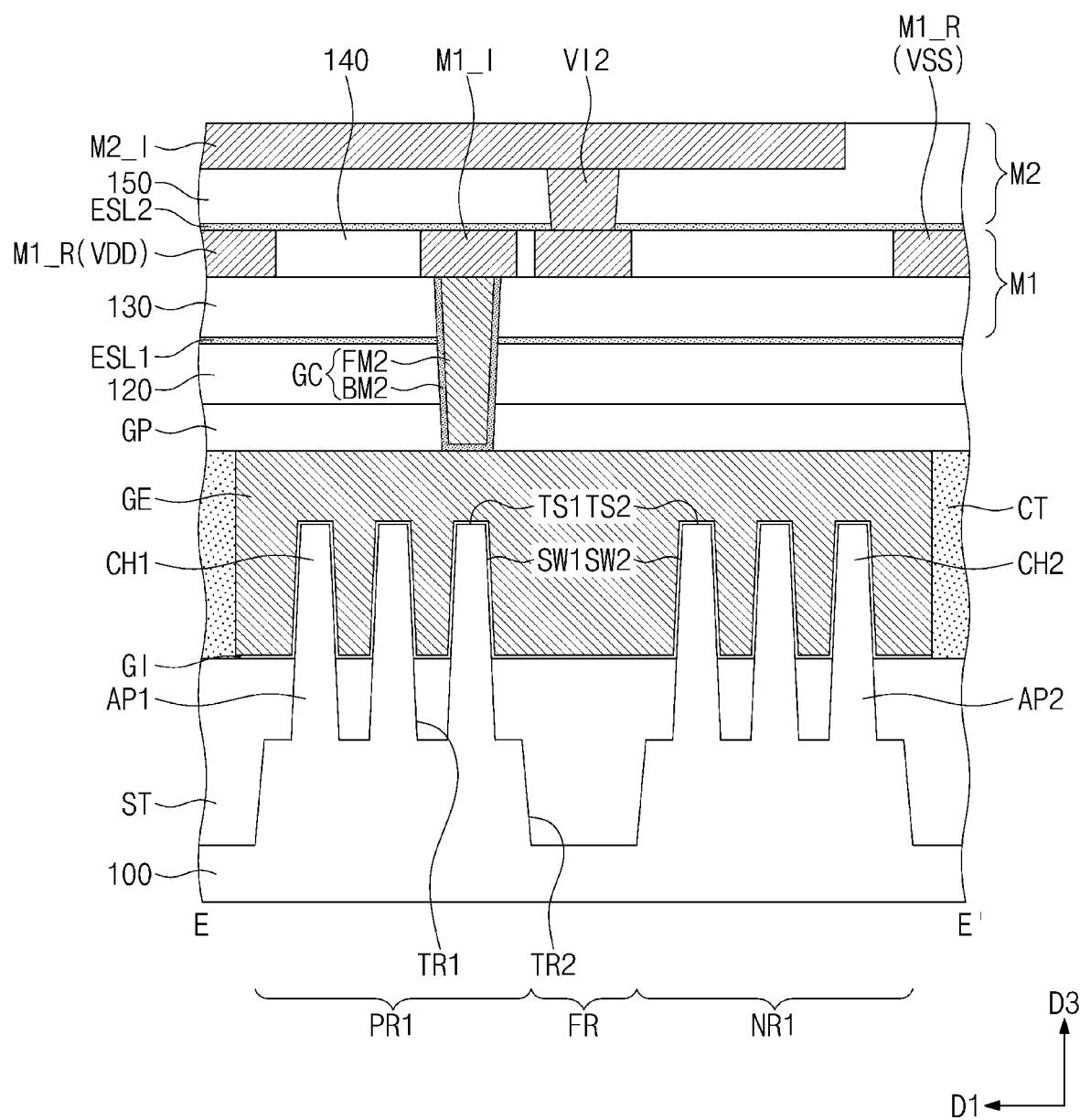

FIG. 10 is a plan view illustrating a semiconductor device according to an embodiment of the inventive concept. FIGS. 11A to 11D are sectional views which are taken along lines A-A', B-B', C-C', and D-D', respectively, of FIG. 10. FIG. 12 is an enlarged sectional view illustrating a portion 'M' of FIG. 11A. In the following description of the present embodiment, elements previously described with reference to FIGS. 1, 2A to 2E, 3A, and 3B may be identified by the same reference numbers without repeating overlapping descriptions thereof, for concise description.

Referring to FIGS. 10, 11A to 11D, and 12, the first etch stop layer ESL1 may extend in the air gap AG. The first etch stop layer ESL1 may fill a remaining portion of the air gap AG. The first etch stop layer ESL1 may include an extending portion EXP, which horizontally extends on the second interlayer insulating layer 120, and a second protruding portion PTP2, which extends from the extending portion EXP toward the air gap AG and/or the first barrier pattern BM1. The second protruding portion PTP2 may be in contact with the top surface of the first barrier pattern BM1. The second protruding portion PTP2 may be in contact with the upper side surface of the first conductive pattern FM1. When viewed in a plan view, the second protruding portion PTP2 may be provided to enclose the first conductive pattern FM1. The second protruding portion PTP2 may be provided between the first conductive pattern FM1 and the gate contact GC. The second protruding portion PTP2 may be adjacent to the gate contact GC in the second direction D2 and may be adjacent to the lower via VI1 in the first direction D1.

FIGS. 13A to 13E are sectional views which are taken along lines A-A', B-B', C-C', D-D', and E-E', respectively, of FIG. 1 to illustrate a semiconductor device according to an embodiment of the inventive concept. In the following description of the present embodiment, elements previously described with reference to FIGS. 1, 2A to 2E, 3A, and 3B may be identified by the same reference numbers without repeating overlapping descriptions thereof, for concise description.

Referring to FIGS. 1 and 13A to 13E, the first PMOSFET region PR1, the second PMOSFET region PR2, the first NMOSFET region NR1, and the second NMOSFET region NR2 may be defined by the second trench TR2 formed in the upper portion of the substrate 100. The first trench TR1 may be defined between adjacent ones of the first active patterns AP1 and between adjacent ones of the second active patterns AP2. The first trench TR1 may be shallower than the second trench TR2.

The device isolation layer ST may be provided to fill the first and second trenches TR1 and TR2. An upper portion of each of the first and second active patterns AP1 and AP2 may be a portion vertically protruding to a level higher than the device isolation layer ST. The upper portion of each of the first and second active patterns AP1 and AP2 may have a fin shape. The device isolation layer ST may not cover the upper portion of each of the first and second active patterns AP1 and AP2. The device isolation layer ST may be provided to cover and contact a lower side surface of each of the first and second active patterns AP1 and AP2.

The first source/drain patterns SD1 may be provided in the upper portions of the first active patterns AP1. The first source/drain patterns SD1 may be impurity regions of a first conductivity type (e.g., p-type). The first channel pattern CH1 may be interposed between each pair of the first source/drain patterns SD1. The second source/drain patterns SD2 may be provided in the upper portions of the second active patterns AP2. The second source/drain patterns SD2 may be impurity regions of a second conductivity type (e.g., n-type). The second channel pattern CH2 may be interposed between each pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The gate electrodes GE may be provided to cross the first and second active patterns AP1 and AP2 and to extend in the first direction D1. The gate electrodes GE may vertically overlap the first and second channel patterns CH1 and CH2.

The gate electrode GE may be provided on a first top surface TS1 and at least one first side surface SW1 of the first channel pattern CH1. The gate electrode GE may be provided on a second top surface TS2 and at least one second side surface SW2 of the second channel pattern CH2. For example, the transistor according to the present embodiment may be a three-dimensional field-effect transistor (e.g., FinFET), in which the gate electrode GE is provided to surround the channel patterns CH1 and CH2 three-dimensionally.

The gate insulating layer GI may be interposed between the gate electrode GE and the first and second channel patterns CH1 and CH2. For example, the gate insulating layer GI may conformally cover the first top surface TS1 and the at least one first side surface SW1 of the first channel pattern CH1 and the second top surface TS2 and the at least one second side surface SW2 of the second channel pattern CH2.

The first interlayer insulating layer 110 and the second interlayer insulating layer 120 may be provided on the substrate 100. The first etch stop layer ESL1 may be provided to cover/contact the second interlayer insulating layer 120. The active contacts AC may be provided to penetrate the first and second interlayer insulating layers 110 and 120 and the first etch stop layer ESL1 and may be electrically connected to and/or contact the first and second source/drain patterns SD1 and SD2, respectively.

The third interlayer insulating layer 130 and the fourth interlayer insulating layer 140 may be provided on the first etch stop layer ESL1. The first metal layer M1 may be provided in the third and fourth interlayer insulating layers 130 and 140. The first metal layer M1 may include the first and second lower interconnection lines M1_R and M1_I and the lower vias VI1.

The gate contact GC may be provided to penetrate the third interlayer insulating layer 130, the first etch stop layer ESL1, the second interlayer insulating layer 120, and the gate capping pattern GP and may be electrically connected to and/or contact the gate electrode GE.

The second etch stop layer ESL2 may be provided to cover/contact the fourth interlayer insulating layer 140. The fifth interlayer insulating layer 150 may be provided on the second etch stop layer ESL2. The second metal layer M2 may be provided in the fifth interlayer insulating layer 150.

The active contact AC, the gate contact GC, the first metal layer M1, and the second metal layer M2 may have or be configured to have substantially the same features as those in the embodiment described with reference to FIGS. 1, 2A to 2E, 3A, and 3B.

According to an embodiment of the inventive concept, since an upper portion of a first barrier pattern is recessed, an air gap may be provided near or on an upper side surface of a first conductive pattern. Thus, it may be possible to prevent a short circuit from being formed between an active contact and a gate contact adjacent thereto. In addition, since the air gap is formed, a parasitic capacitance between the active contact and the gate contact may be lowered.

According to an embodiment of the inventive concept, a lower via, which is electrically connected to and/or contact the active contact, may include a first protruding portion, which protrudes toward the air gap or toward the first barrier pattern and is in contact with the upper side surface of the first conductive pattern. Thus, an electrical resistance between the lower via and the active contact may be reduced. In addition, the lower via may be disposed at a position that is offset from the gate contact in a first direction. Accordingly, it may be possible to prevent a short circuit from being formed between the lower via and the gate contact. As a result, the electric characteristics of the semiconductor device may be improved.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be interchangeably combined with components and/or features of other embodiments unless the context indicates otherwise.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   a PMOSFET region and an NMOSFET region, which are spaced apart from each other in a first direction on a substrate;
   a first active pattern and a second active pattern provided on the PMOSFET region and the NMOSFET region, respectively;
   a first channel pattern on the first active pattern;
   a source/drain pattern electrically connected to the first channel pattern;
   an active contact electrically connected to the source/drain pattern, the active contact comprising a first conductive pattern and a first barrier pattern enclosing a portion of a side surface and a bottom surface of the first conductive pattern;
   a gate electrode extending in the first direction to cross the first channel pattern;
   a gate contact electrically connected to the gate electrode;
   an air gap provided on the first barrier pattern to be adjacent to the side surface of the first conductive pattern; and
   a lower via provided on the active contact,
   wherein the lower via is adjacent to the air gap in the first direction, and
   the air gap is provided between the gate contact and the first conductive pattern.

2. The semiconductor device of claim 1, further comprising a field region provided on the substrate and between the PMOSFET region and the NMOSFET region,
   wherein the gate contact vertically overlaps the PMOSFET region, and
   the lower via vertically overlaps the field region.

3. The semiconductor device of claim 1, wherein the gate contact is adjacent to the air gap in a second direction crossing the first direction, and
   the lower via is offset from the gate contact in the first direction.

4. The semiconductor device of claim 1, wherein the lower via comprises:
   a body portion on the first conductive pattern; and
   a protruding portion protruding from the body portion toward the first barrier pattern.

5. The semiconductor device of claim 4, wherein a top surface of the first barrier pattern is located at a level lower than a top surface of the first conductive pattern, and
   the protruding portion is in contact with the top surface of the first barrier pattern.

6. The semiconductor device of claim 4, wherein the protruding portion is in contact with an upper side surface of the first conductive pattern and is adjacent to the air gap in the first direction.

7. The semiconductor device of claim 1, wherein a top surface of the gate contact is coplanar with a top surface of the lower via.

8. The semiconductor device of claim 1, wherein the gate contact vertically overlaps the PMOSFET region, and
   the lower via vertically overlaps the NMOSFET region.

9. The semiconductor device of claim 1, further comprising an etch stop layer provided on the active contact,
   wherein the lower via is provided to penetrate the etch stop layer, and
   the air gap is defined by the etch stop layer.

10. The semiconductor device of claim 1, wherein the first channel pattern comprises semiconductor patterns, which are vertically stacked to be spaced apart from each other, and
    the gate electrode is provided to enclose the semiconductor patterns.

11. A semiconductor device, comprising:
    a PMOSFET region and an NMOSFET region on a substrate, the PMOSFET region and the NMOSFET region being adjacent to each other in a first direction;

a first active pattern and a second active pattern provided on the PMOSFET region and the NMOSFET region, respectively;
a source/drain pattern on the first active pattern;
gate electrodes provided to cross the PMOSFET region and the NMOSFET region;
an active contact electrically connected to the source/drain pattern, the active contact comprising a first conductive pattern and a first barrier pattern exposing an upper side surface of the first conductive pattern;
an air gap provided adjacent to the upper side surface of the first conductive pattern;
a lower via electrically connected to the active contact; and
a gate contact electrically connected to one of the gate electrodes,
wherein the gate contact is adjacent to the air gap in a second direction crossing the first direction, and
the lower via is offset from the gate contact in the first direction.

12. The semiconductor device of claim 11, wherein the lower via comprises:
a body portion on the first conductive pattern; and
a protruding portion, which extends from the body portion toward the first barrier pattern and is in contact with a top surface of the first barrier pattern.

13. The semiconductor device of claim 12, wherein the protruding portion is adjacent to the air gap in the first direction.

14. The semiconductor device of claim 11, further comprising a field region, which is provided between the PMOSFET region and the NMOSFET region and on the substrate,
wherein the lower via vertically overlaps the field region.

15. The semiconductor device of claim 11, further comprising an etch stop layer covering the active contact,
wherein the air gap is defined by a bottom surface of the etch stop layer.

16. A semiconductor device, comprising:
a substrate including a PMOSFET region and an NMOSFET region, which are spaced apart from each other in a first direction;
a first active pattern on the PMOSFET region and a second active pattern on the NMOSFET region;
a first source/drain pattern on the first active pattern and a second source/drain pattern on the second active pattern;
a first channel pattern electrically connected to the first source/drain pattern and a second channel pattern electrically connected to the second source/drain pattern, each of the first and second channel patterns comprising a first semiconductor pattern, a second semiconductor pattern, and a third semiconductor pattern, which are vertically stacked to be spaced apart from each other;
gate electrodes extending in the first direction to cross the first and second channel patterns;
a gate insulating layer interposed between the gate electrodes and the first and second channel patterns;
a gate spacer provided on a side surface of a gate electrode;
a gate capping pattern provided on a top surface of the gate electrode;
a first interlayer insulating layer on the gate capping pattern;
an active contact provided to penetrate the first interlayer insulating layer and electrically coupled to the first source/drain pattern, the active contact comprising a first barrier pattern and a first conductive pattern provided on the first barrier pattern;
a second interlayer insulating layer on the first interlayer insulating layer;
a gate contact provided to penetrate the first and second interlayer insulating layers and electrically coupled to the gate electrode;
a first metal layer provided in the second interlayer insulating layer, the first metal layer comprising a lower via, which is provided to penetrate the second interlayer insulating layer and is electrically coupled to the active contact;
a third interlayer insulating layer on the second interlayer insulating layer; and
a second metal layer provided in the third interlayer insulating layer,
wherein a top surface of the first barrier pattern is located at a level lower than a top surface of the first conductive pattern,
the lower via comprises a body portion, which is provided on a top surface of the first conductive pattern, and a first protruding portion, which protrudes from the body portion in a direction toward the substrate, and
the first protruding portion of the lower via is in contact with an upper side surface of the first conductive pattern and the top surface of the first barrier pattern.

17. The semiconductor device of claim 15, further comprising an air gap, which is adjacent to the upper side surface of the first conductive pattern and is adjacent to the first protruding portion of the lower via in the first direction.

18. The semiconductor device of claim 17, wherein the lower via is adjacent to the air gap in the first direction, and
the air gap is provided between the gate contact and the first conductive pattern.

19. The semiconductor device of claim 16, further comprising an etch stop layer interposed between the first and the second interlayer insulating layers,
wherein the etch stop layer includes a second protruding portion,
wherein the second protruding portion protrudes in a direction toward the first barrier pattern, and
wherein the second protruding portion of the etch stop layer is adjacent to the first protruding portion of the lower via in the first direction.

20. The semiconductor device of claim 16, wherein a top surface of the gate contact is coplanar with a top surface of the lower via.

* * * * *